(12) United States Patent
Shiba et al.

(10) Patent No.: US 7,868,323 B2
(45) Date of Patent: Jan. 11, 2011

(54) THIN FILM TRANSISTOR DEVICE, IMAGE DISPLAY DEVICE AND MANUFACTURING METHOD THEREOF

(75) Inventors: Takeo Shiba, Kodaira (JP); Masahiko Ando, Cambridge (GB); Masahiro Kawasaki, Tsukuba (JP); Masaaki Fujimori, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 407 days.

(21) Appl. No.: 11/953,065

(22) Filed: Dec. 9, 2007

(65) Prior Publication Data

US 2008/0157067 A1 Jul. 3, 2008

(30) Foreign Application Priority Data

Dec. 11, 2006 (JP) .............................. 2006-332763

(51) Int. Cl.
*H01L 35/24* (2006.01)
*H01L 51/00* (2006.01)
(52) U.S. Cl. .............................. 257/40; 257/59; 257/72; 257/E51.001
(58) Field of Classification Search ................... 257/40, 257/59, 72, E51.001
See application file for complete search history.

(56) References Cited

U.S. PATENT DOCUMENTS

| 6,479,837 | B1 | 11/2002 | Ogawa et al. | |
| 6,852,997 | B2* | 2/2005 | Yamazaki et al. | 257/40 |
| 6,905,906 | B2 | 6/2005 | Sirringhaus et al. | |
| 2002/0044208 | A1* | 4/2002 | Yamazaki et al. | 348/272 |
| 2004/0256623 | A1* | 12/2004 | Yamazaki | 257/72 |
| 2005/0116240 | A1* | 6/2005 | Kim et al. | 257/88 |
| 2005/0116630 | A1* | 6/2005 | Kim et al. | 313/506 |
| 2006/0258070 | A1* | 11/2006 | Han | 438/167 |
| 2007/0087487 | A1* | 4/2007 | Honda | 438/149 |

FOREIGN PATENT DOCUMENTS

| JP | 64-002088 A | 1/1989 |
| JP | 11-085065 A | 3/1999 |
| JP | 2000-243970 A | 9/2000 |
| JP | 2004-134694 A | 4/2004 |

\* cited by examiner

*Primary Examiner*—Kenneth A Parker
*Assistant Examiner*—Anthony Ho
(74) *Attorney, Agent, or Firm*—Miles & Stockbridge P.C.

(57) ABSTRACT

In an image display device comprising a display part configured with a plurality of pixels and a peripheral integrated circuit which controls the display part, the display device is provided on a support substrate which has high durability for the impact and the bending, the pixel circuit is configured with an organic semiconductor TFT, the peripheral integrated circuit is configured with a low-temperature poly Si-TFT, this peripheral integrated circuit is provided on a support substrate of the display device being removed the support substrate when being manufactured, and the pixel circuit and the peripheral integrated circuit are connected with the same wire layer.

5 Claims, 16 Drawing Sheets

(a) A-A' CROSS SECTION (b) B-B' CROSS SECTION

THIN FILM TRANSISTOR DEVICE, IMAGE DISPLAY DEVICE AND MANUFACTURING METHOD THEREOF

CLAIM OF PRIORITY

The present application claims priority from Japanese application JP 2006-332763 filed on Dec. 11, 2006, the content of which is hereby incorporated by reference into this application.

BACKGROUND OF THE INVENTION

The present invention relates to a thin film transistor device, an image display device, and a manufacturing method thereof, and in particular, to a transistor integrated circuit substrate and an active-matrix display to which the same is applied, and in particular, to a thin film transistor substrate which is superior in being of thin type and light weight, in the durability for the impact, and in the flexibility and with which the low cost of manufacturing is possible, an image display device, and a manufacturing method thereof.

As the first conventional technique there are a thin film transistor (hereinafter it will be called TFT) using an organic semiconductor and an active-matrix type display to which the same is applied, and for example, they are disclosed in JP-A-2004-134694 and U.S. Pat. No. 6,905,906. In these well known examples, the solution-processed printing technique is used for the manufacturing of TFT and it makes it possible to manufacture TFT with low temperature and at the low cost on a substrate such as a plastic substrate which has the flexibility.

Also, as the second conventional technique there is an active-matrix type display using a low-temperature poly Si-TFT, and for example, it is described in detail in JP-A-64-2088, JP-A-11-85065, and JP-A-2000-243970, etc. In these well known examples, as the performance of the poly Si-TFT is high, even in the large area such as an image display device, the integration of the high functional transistor circuit becomes possible and both of the display part and the peripheral integrated circuit can be built in on the same substrate by the poly Si-TFT circuit.

SUMMARY OF THE INVENTION

In the near future, it is expected to realize a so-called flexible electronic device such as a display device which is superior in being of thin type and light weight, in the durability for the impact, in the portability, and in the storage, an image display device which can be mounted on a curved surface, a matrix sensor which is used being bended, and an integrated circuit added label which can be mounted on a curved surface. Also, these devices are the ones which have a relatively large area of no less than from a few cm squares to a few tens cm squares, it is necessary to reduce the manufacturing cost per unit area. As a transistor substrate technique to realize these devices there is the organic TFT which is the above-mentioned first conventional technique, but the circuit driving performance of these organic TFTs is greatly lower compared with the single crystal Si transistor, it is difficult to configure the peripheral integrated circuit with these. For this reason, the peripheral integrated circuit is configured with a Si integrated circuit which is generally called LSI, but there are a problem of the reliability of the mounting and a problem that LSI itself is broken when it is bended. For this reason, it has the low durability for the impact and it is difficult to use it on a curved surface.

Also, the poly Si-TFT which is the above-mentioned second conventional technique has the manufacturing temperature of no less than 400° C. and it is difficult to manufacture TFT across the overall substrate which has the flexibility such as a plastic substrate. For this reason, a so-called transfer technique is necessary to after manufacturing the poly Si-TFT integrated circuit on a glass support substrate which has a high heat-resistance make the support substrate a thin film or remove it, and provide it again on the flexible substrate. For this reason, there is a problem of the increasing of the manufacturing cost and it is difficult to transfer a device of large area such as a few tens cm squares.

(1) Citing an example of the point of the present invention, it will be as the followings.

A thin film transistor (TFT) device comprising a matrix image display array part comprising a plurality of circuit blocks and a peripheral integrated circuit part configured with a plurality of circuit blocks arranged on the periphery of said array part, wherein a circuitry of said matrix image display array part is configured using an organic semiconductor TFT device, said peripheral integrated circuitry is configured using at least one of a Si transistor device and a poly Si-TFT device, said circuitry and at least one of said Si transistor device and said poly Si-TFT device are provided on the same substrate, and between an electrode of said organic semiconductor TFT device and an electrode of at least one of said Si transistor device and said poly Si-TFT device it is connected by a wire layer provided on the substrate.

In the thin film transistor device of the present invention, the matrix image display array part is provided in the central part and in its peripheral part, the poly Si-TFT circuit, LSI, etc. such as a buffer amplifier circuit, a shift register circuit, a DA converter circuit, a decoder circuit, a level shifter circuit, a frame memory circuit, a power supply circuit, a control circuit, etc. of the display device are provided. These circuitries are all provided on the substrate.

In the circuitry of said array part, the organic semiconductor TFT devices are provided in a matrix.

Said peripheral integrated circuitry includes either the Si transistor device or the poly Si-TFT device.

These circuitries and either said Si transistor device or said poly Si-TFT device are provided on the same substrate.

Between the electrode of said organic semiconductor TFT device and the electrode of either said Si transistor device or said poly Si-TFT device it is connected by the wire layer provided on the substrate.

With the starting point at an electrode part of a transistor, a diode, a capacity, and a resistance configuring the organic TFT circuit, a wire extended from there is connected to an electrode of a transistor, a diode, a capacity, and a resistance configuring the peripheral Si transistor circuit. For this, for example, a wire layer formed by printing is used.

The "peripheral integrated circuit" is, for example, a buffer amplifier circuit, a shift register circuit, a DA converter circuit, a decoder circuit, a level shifter circuit, a frame memory circuit, a power supply circuit, a control circuit, etc. of the display device which is arranged on the periphery of the display part. For a part of these, the one which is commercially available as a device of LSI, etc. may be used.

(2) The above-mentioned problems can be solved by measures as the followings. Namely, in first to fourth embodiments, the peripheral integrated circuit of the active-matrix display is formed with a low-temperature poly Si-TFT, and after making a support substrate a thin film or removing the same and providing the peripheral integrated circuit on the periphery of a pixel array on the image display device substrate, a pixel organic TFT circuit array is formed by a solution process and/or printable process. These peripheral integrated circuit and pixel array are connected by a solution wire process and/or printable wire process in the same way.

In a fifth embodiment, the peripheral integrated circuit of the active-matrix display is formed with the low-temperature poly Si-TFT, and this peripheral integrated circuit is provided on the periphery of the pixel array on the image display device substrate. Thereafter, the support substrate of this periphery integrated circuit is removed and the pixel organic TFT circuit array is formed by the solution process and/or printable process. These peripheral integrated circuit and pixel array are connected by the solution wire process and/or printable wire process in the same way.

In sixth and seventh embodiments, a poly Si-TFT integrated circuit is formed directly in a peripheral area of the pixel array on the image display device substrate by a low temperature process, thereafter the pixel organic TFT circuit array is formed by the solution process and/or printable process. These peripheral integrated circuit and pixel array are connected by the solution wire process and/or printable wire process in the same way.

In an eighth embodiment, an image display device of further larger area is configured by arranging a plurality of image display devices obtained by the above-mentioned embodiments. Thereby, it becomes possible to manufacture an image display device of large area at the lower cost than the conventional.

According to the present invention, it is possible to provide an electronic device, in particular an image display device, which has high durability for the impact and the bending and can be used being bended and can be mounted on a curved surface. Further, it reduces the manufacturing cost by reducing the number of manufacturing processes of these electronic devices and makes it easy to make them larger.

The explanations of the signs in the figures are as the followings.

DESCRIPTION OF THE EMBODIMENTS

Embodiment 1

The first embodiment of the present invention will be explained using FIGS. 1~5 and FIGS. 15A~15E below. This embodiment is an embodiment of an active-matrix reflective image display device of thin type and light weight, and for example, its display device is an electrophoretic display with memory effect, a reflective liquid crystal display device, etc., and its resolution is about 100~400 pixel/inch, its area is about from a few cm squares to a few tens cm squares, its thickness is no more than 2 mm, and its weight is no more than 200 g.

Figure 1:
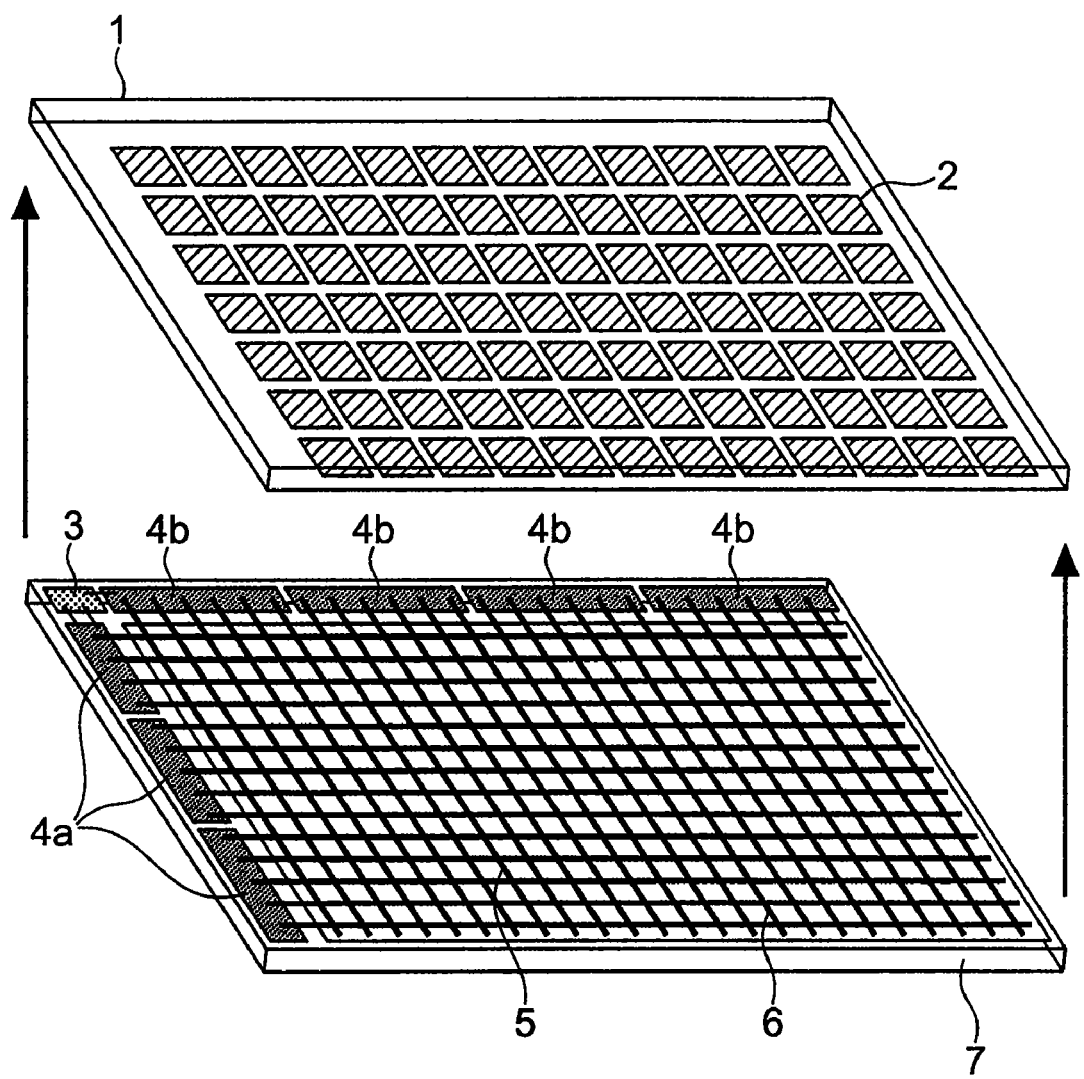
FIG. 1 is a schematic sketch diagram of a display device which is a first embodiment.

First, it will be described about the overall configuration of this embodiment. FIG. 1 is a schematic sketch diagram explaining the configuration of an active-matrix display and it shows a TFT substrate to drive pixel of the lower part and a display device of the upper part in a separate form. The display device of the upper part is, for example, an electrophoretic display with memory effect, a reflective liquid crystal display device, etc. Also, as a TFT substrate, a TFT substrate in which the pixel circuit array is configured with an organic TFT and the peripheral integrated circuit which drives the pixel is configured with the low-temperature poly Si-TFT is taken as an example.

In FIG. 1, the TFT substrate to drive pixel uses, for example, a plastic support substrate 7 which is of thin type and light weight and has the flexibility and is usable even when it is bended about the radius of curvature of about 5 cm or below. It includes a pixel array area 6 in which the pixel circuits configured with the organic TFT are arranged in a matrix and pixel driving peripheral integrated circuits 4a and 4b configured with the low-temperature poly Si-TFT on this plastic support substrate 7, and these circuits are connected by wire 5. The peripheral integrated circuit is configured with scanning system (vertical system) and signal system (horizontal system). The peripheral circuit of scanning system is the one in which a plurality of integrated circuits 4a are arranged on the substrate. The peripheral circuit of signal system is the one in which a plurality of integrated circuits 4b are arranged on the substrate.

On a display device substrate 1 of the upper part, pixels 2 which are configured with the display device are arranged in a matrix, and each pixel 2 corresponds to each pixel circuit of the TFT substrate of the lower part. These display pixels and TFT circuits are interleaved between the support substrate (plastic substrate) 7 of the lower part and the support substrate 1 of the upper part and configure the thin type and light weight reflective image display device.

Here, for the substrates 1, 7 of the upper and lower parts are, for example, a plastic substrate of polyethylene terephthalate, polyethylene naphthalate, polycarbonate, polyimide, etc. is practicable, but it is not limited to the plastic substrate in this embodiment. Also, other than the plastic substrate, for example, a thin film glass substrate can be used. Further, for the lower part support substrate 7, a metal thin film substrate and the like can be used. Also, the integrated circuits 4a and 4b consisting of the low-temperature poly Si-TFT can be configured with one integrated circuit substrate respectively in the scanning system and the signal system without arranging them being divided into a plurality of circuits as in this embodiment. Further, the pixel 2, the wire 5 and the like shown in FIG. 1 are shown to explain the outline, and the numbers of the pixels 2 and the wires 5 are not limited to this figure.

Figure 2:
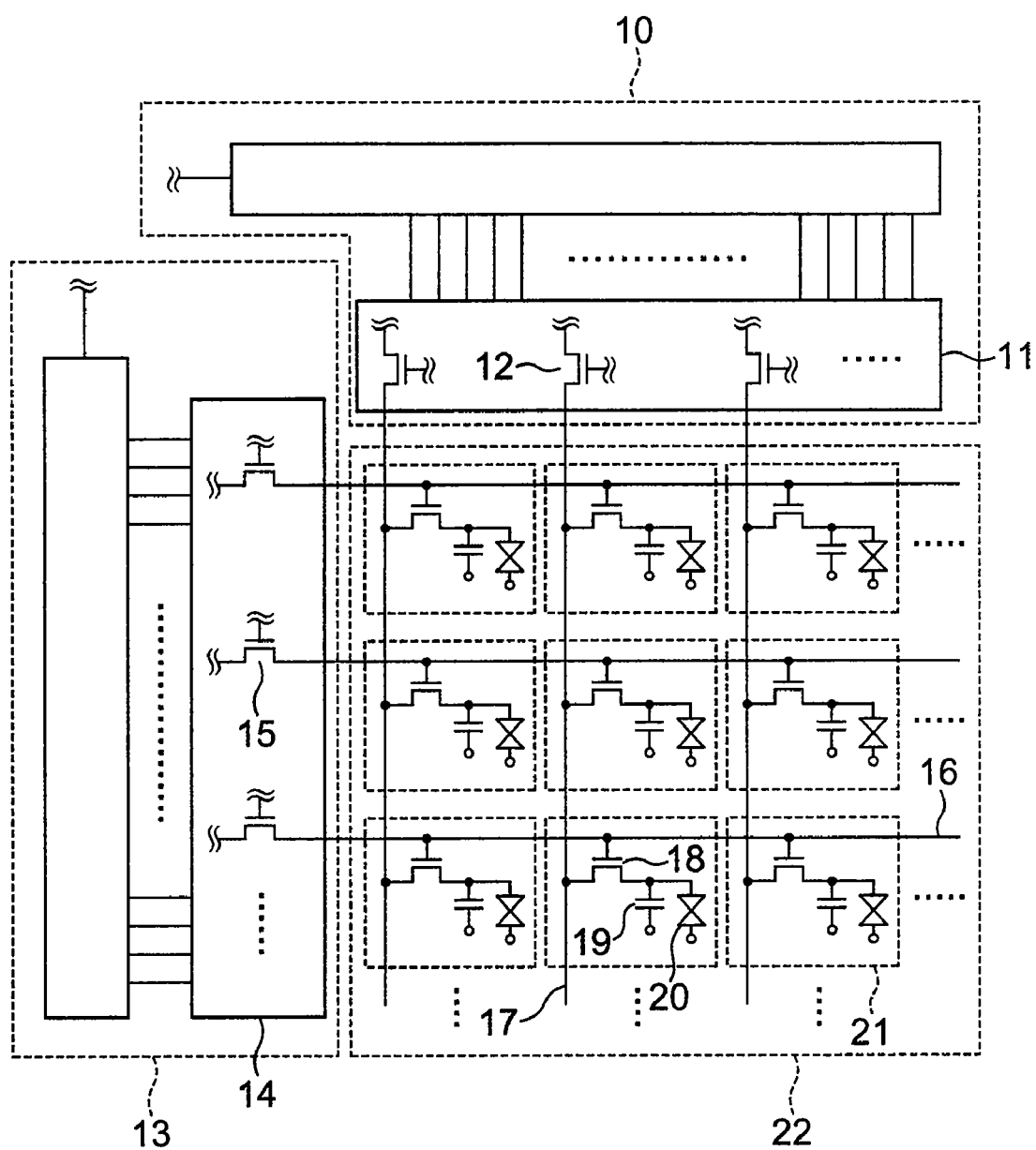
FIG. 2 is a schematic configuration diagram of the display device which is the first embodiment.

FIG. 2 is a schematic diagram of the panel configuration and a pixel 21 and a peripheral integrated circuit which are surrounded by the dotted line show a part of them. The pixel driving peripheral integrated circuit includes a scanning system (vertical system) circuit 13 and a signal system (horizontal system) circuit 10, and is configured with the low-temperature poly Si-TFT. The scanning system circuit includes an address decoder, a shift register, a level shifter, a buffer circuit 14, etc. and also the signal system circuit includes an address decoder, a shift register, a level shifter, a DA converter circuit, a buffer circuit 11, etc.

In each of the buffer circuits, a part of a buffer TFTs 12 and 15 are shown. A switching TFT of each pixel is driven by the buffer TFTs 12 and 15 via a drain line 17 and a gate line 16.

Figure 3:
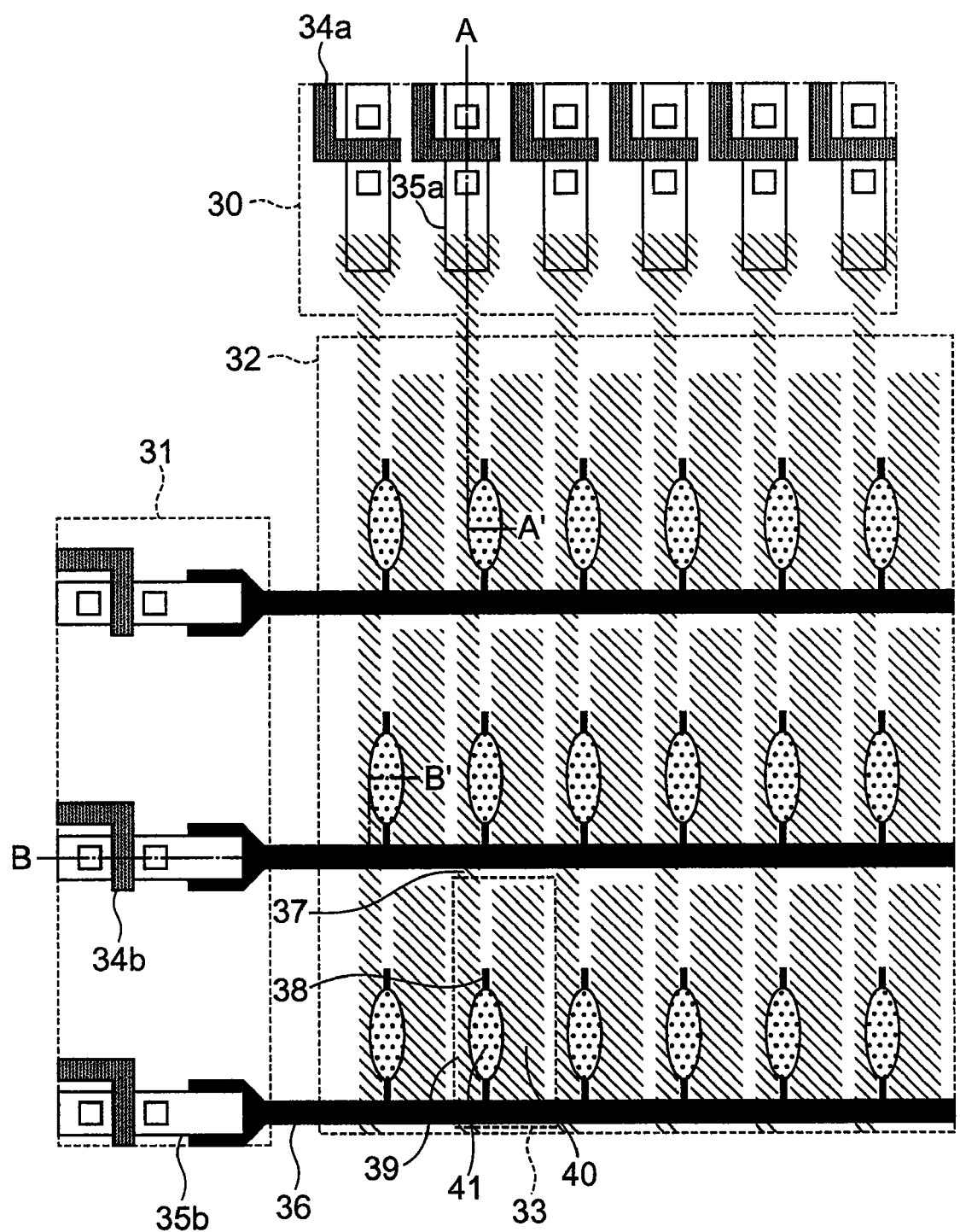
FIG. 3 is a schematic plan view of the display device which is the first embodiment.
Figure 4:
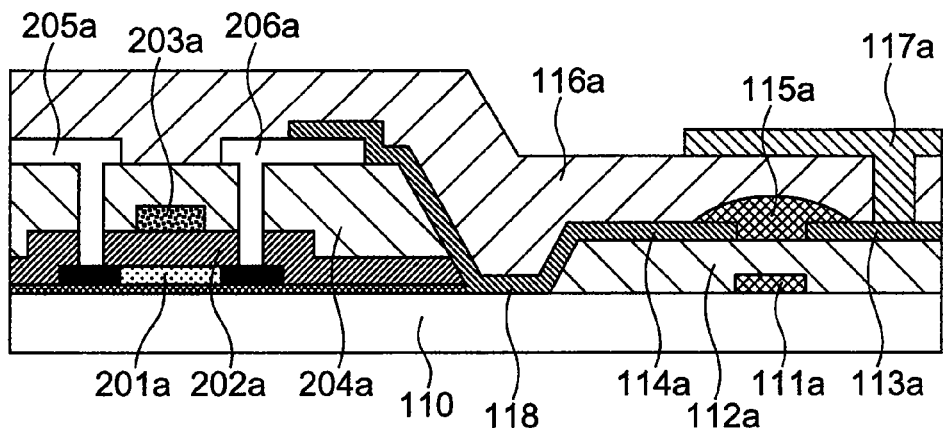
FIG. 4 is a cross section structure diagram of the display device which is the first embodiment.
Figure 4:
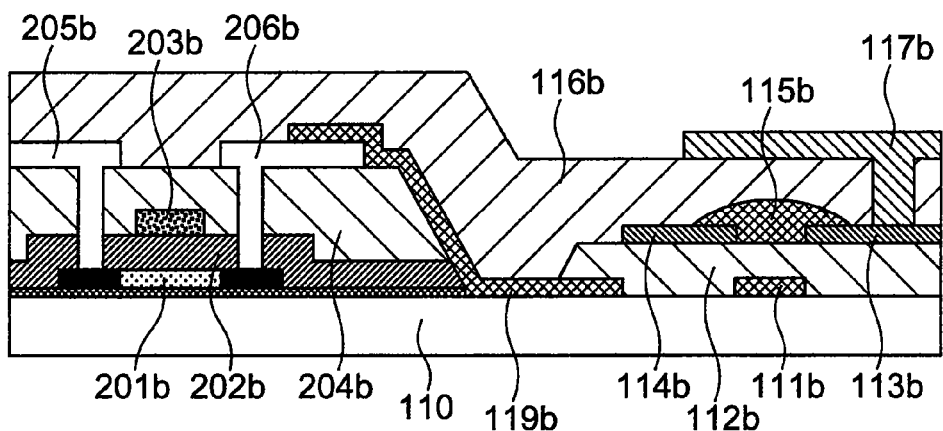

Next, a plan view and a cross section structure diagram of a part of the TFT substrate according to the present invention are shown in FIGS. 3 and 4 respectively. In FIG. 3, a plane structure embodying a part of the pixel array and a part of the buffer TFT in the peripheral buffer circuit is shown. Also, cross section structures between AA' and BB' shown by a one dotted chain line in FIG. 3 are shown in FIGS. 4A and 4B respectively.

In an area shown by a pixel 33 of FIG. 3, a plane structure of a switching TFT 18 of an equivalent circuit in the pixel of FIG. 2 is shown. The gate line 16 and the drain line 17 of FIG. 2 correspond to a gate line 36 and a drain line 37 of FIG. 3 respectively, also, a channel, a source electrode, and a drain electrode of the switching TFT correspond to an organic semiconductor 41, a source electrode 40, and drain electrode 39 of FIG. 3 respectively.

A part of a plane structure of the buffer TFTs 12 and 15 configuring the buffer circuits 11 and 14 of FIG. 2 are shown in 30 and 31 of FIG. 3 respectively. In FIG. 3, a drain electrode 39 of the switching TFT is connected to a drain electrode 35a of the buffer TFT in the signal system buffer circuit via the drain line 37 formed with the same wire layer. Also, a gate electrode 38 of the switching TFT is connected to a drain electrode 35b of the buffer TFT in the scanning system buffer circuit via the gate line 36 formed with the same wire layer.

Next, a manufacturing method of TFT and a cross section structure of TFT will be explained by FIGS. 15A~15E showing manufacturing processes and cross section structures of TFT and FIG. 4 showing cross section structures of the TFT substrate. A cross section structure diagram in which the buffer TFT in the signal system buffer circuit and the pixel organic TFT are connected in the low-temperature poly Si-TFT integrated circuit is shown in FIG. 4A. Also, a cross section structure diagram in which the buffer TFT in the scanning system buffer circuit and the pixel organic TFT are connected is shown in FIG. 4B.

First, the low-temperature poly Si-TFT can be formed after being subjected to the manufacturing processes as the followings. Namely, explaining the outline by FIG. 15A, for example in this embodiment, after accumulating an amorphous Si film on a glass support substrate 200, the crystal growth is expedited in the scanning direction of the laser radiating light using the CW solid-state laser, a channel layer 201 consisting of a poly Si film is formed and gets patterning by the lithography process. Here, as another method to form the poly Si film, it is possible to crystallize the amorphous Si film by pulse laser annealing or to accumulate the poly Si film directly by the CVD method and the like. Next, a gate insulation film 202 consisting of a Si oxide film is accumulated, for example, by the plasma CVD method and the like. Next, a gate electrode 203 consisting of a metal film of Mo, W, etc. is accumulated, for example, by sputtering and the like, and gets patterning by the lithography process. Next, the install of impurity and the heat processing necessary to form the TFT are performed and after accumulating a protection film 204, connection areas for a source electrode 205 and a drain electrode 206 are opened selectively. Next, a metal film of Al and the like is accumulated, for example, by sputtering and the like, and the source electrode 205 and the drain electrode 206 are formed by performing the patterning by the lithography process, and the low-temperature poly Si-TFT integrated circuit is formed by performing the necessary connection by these electrodes. These manufacturing processes of the low-temperature poly Si-TFT are formed with the process temperature of no more than 600° C. all but except for the laser annealing process.

Figure 15A:
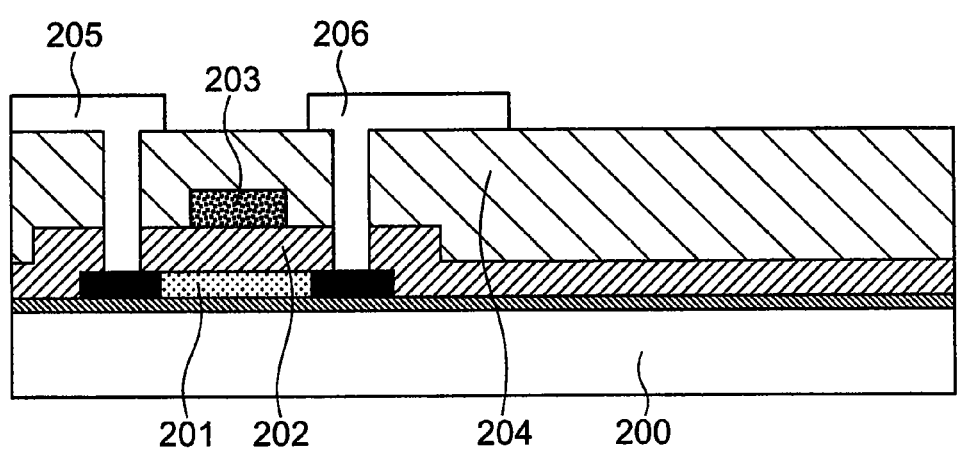
FIG. 15A is a TFT substrate manufacturing process cross section structure diagram of the display device which is the first embodiment.
Figure 15B:
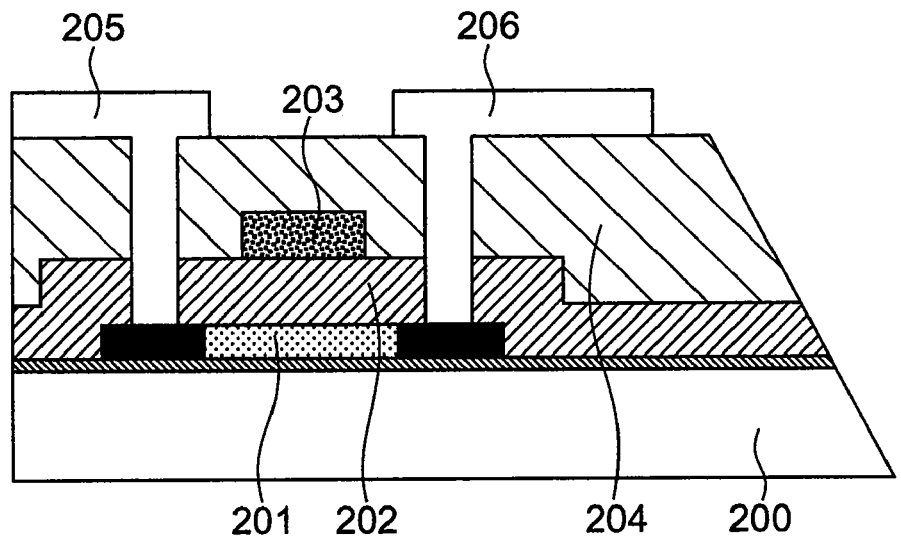
FIG. 15B is a TFT substrate manufacturing process cross section structure diagram of the display device which is the first embodiment.
Figure 15C:
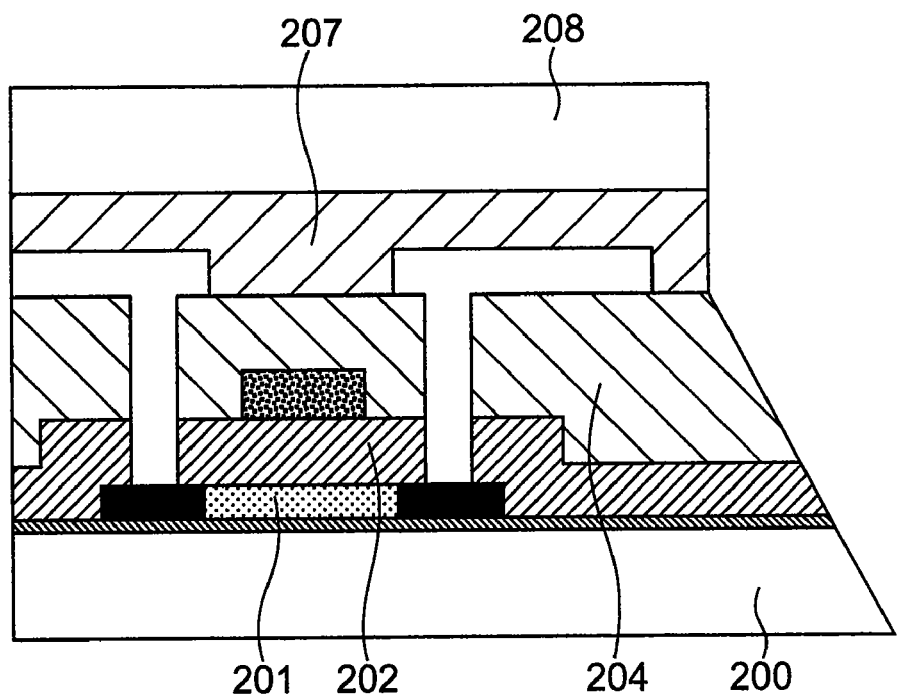
FIG. 15C is a TFT substrate manufacturing process cross section structure diagram of the display device which is the first embodiment.
Figure 15D:
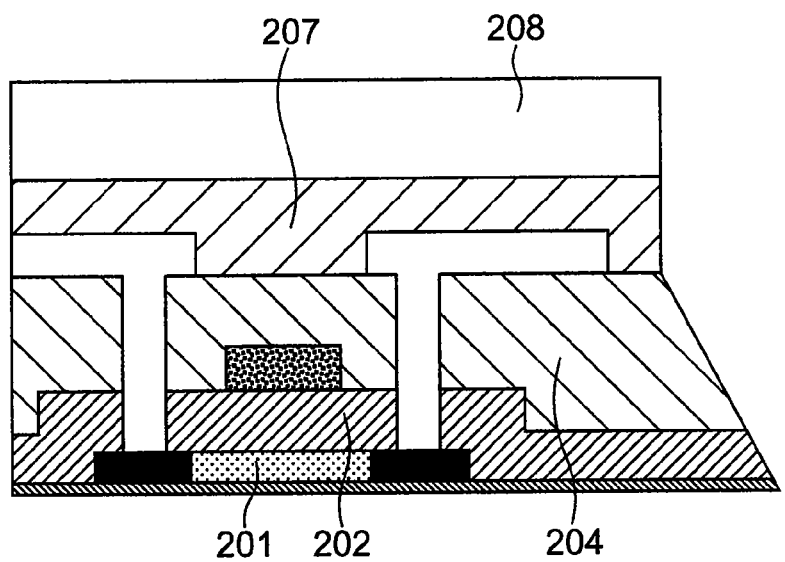
FIG. 15D is a TFT substrate manufacturing process cross section structure diagram of the display device which is the first embodiment.

Next, it will be explained the outline of the manufacturing process to provide the low-temperature poly Si-TFT integrated circuit on the plastic support substrate by FIGS. 15B~15E. First, in FIG. 15B, a low-temperature poly Si-TFT integrated circuit substrate is cut out in a desired area being tapered like the cross section form shown in FIG. 15B, after getting affixed to another support substrate 208 via an adhesive layer 207 as shown in FIG. 15C, the glass support substrate 200 is removed or made to be a thin film by a method such as polishing, etching, etc. as shown in FIG. 5D. Here, the order of the manufacturing processes explained in FIGS. 15B~15D is not limited to this embodiment, and for example, it is also possible to cut out the low-temperature poly Si-TFT integrated circuit in the desired area after affixing the low-temperature poly Si-TFT substrate to another support substrate 208 via the adhesive layer 207 and removing the glass support substrate 200 or making it a thin film by a method such as polishing, etching, etc.

Figure 15E:
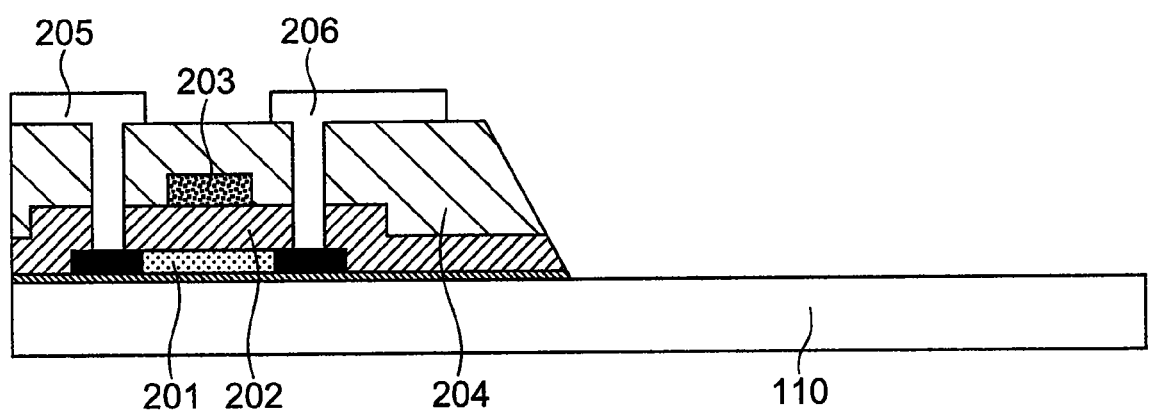
FIG. 15E is a TFT substrate manufacturing process cross section structure diagram of the display device which is the first embodiment.

Further, as shown in FIG. 15E, after laminating a gas barrier layer of water, oxygen, etc. on the plastic support substrate 110 of thickness of no more than about 200 μm, a peripheral integrated circuit configured with the low-temperature poly Si-TFT is provided by a method such as affixing, etc. Next, the adhesive layer 207 and the support substrate 208 are removed. In this way, a very thin low-temperature poly Si-TFT integrated circuit substrate with a total film thickness of no more than 5 μm can be provided on the plastic substrate 110. Also as shown in FIG. 15E, as the side form of the gate insulation film 202 and the protection film 204 is a tapered shape, when providing the wire which will be formed in the printing process after this extending it on the low-temperature poly Si-TFT integrated circuit substrate, it is possible to improve the coverage of the wire in the step part and make the faulty such as a snapping of a wire, etc. hardly occur.

In this embodiment, it is possible to form a high performance peripheral integrated circuit by forming the poly Si-TFT with the field effect mobility of no less than 300 cm²/Vs by using the CW solid-state laser as a manufacturing method to form the poly Si film, expediting the crystal growth, and further arranging the source drain electrode so that the current direction is unified to the crystal growth direction. Also, as a peripheral integrated circuit, it is possible to use it combined with a high performance Si integrated circuit such as a high frequency communication circuit, a high speed processor, etc. as the need arises. For example, in order to use the image display device of this embodiment in a network environment, a very thin single crystal Si integrated circuit with a total film thickness of no more than 5 μm is formed by forming a high frequency communication circuit of no less than 10 GHz of frequency, a processor, and a Si integrated circuit which consists of memory on a thin film SOI (Silicon on Insulator) substrate and removing the support Si substrate. Thereafter, for example as shown in FIG. 1, this high frequency integrated circuit 3 consisting of a single crystal Si thin film transistor is installed on the corner of the substrate on which the pixel driving peripheral integrated circuits 4a and 4b are not installed, and in a wire forming process after this, the single crystal Si integrated circuit 3 and the pixel driving peripheral integrated circuits 4a and 4b are connected.

In this way, after providing the peripheral integrated circuit on the plastic support substrate 110, the organic semiconductor TFT and the wire are formed on the support substrate 110, and the pixel array in which the pixel circuits are arranged in a matrix is formed. This organic semiconductor TFT can be formed, for example, by using the solution process and/or printable process and making the process temperature no more than 200° C. It will be explained the outline of the manufacturing method using FIG. 4 below.

First, gate electrodes 111a, 111b and a gate line 119b are formed by the printable patterning process using a metal ink material. On this occasion, as shown in the BB' cross section diagram of FIG. 4B, the gate electrode 111b of the organic TFT and a drain electrode 206b of the low-temperature poly Si-TFT are connected by extending and providing the gate line 119b formed by the printed wiring up to the upper part of the drain electrode 206b of the low-temperature poly Si-TFT. Next, for example, gate insulation films 112a and 112b of the organic polymer material are partially coated by the printing process. Next, source electrodes 113a and 113b, drain electrodes 114a and 114b, and a drain line 118 are formed by the printable patterning technique of the metal ink. On this occasion, as shown in the AA' cross section diagram of FIG. 4A, the drain electrode 114a of the organic TFT and a drain electrode 206a of the low-temperature poly Si-TFT are connected by extending and providing the drain line 118 formed by the printed wiring up to the upper part of the drain electrode 206a of the low-temperature poly Si-TFT. Next, organic semiconductor films 115a and 115b are selectively coated by the printable patterning process only in the area of the organic TFT which is to be the channel. Next, in both of the TFT areas of the organic TFT and the low-temperature poly Si-TFT, protection films 116a and 116b consisting of, for example, the organic polymer material are selectively coated by the printable patterning process. Finally, pixel electrodes 117a and 117b are formed by the printable patterning process and the TFT substrate is completed.

In this way, the drain electrodes 206a and 206b of the low-temperature poly Si-TFT and the printed wires 118 and 119b can be connected. It is also possible to make these connections more secure by performing the printing of the metal ink after performing the surface process to improve the wettability of the printing material on the drain electrodes 206a, 206b of the low-temperature poly Si-TFT before performing this printing wire.

Figure 5:
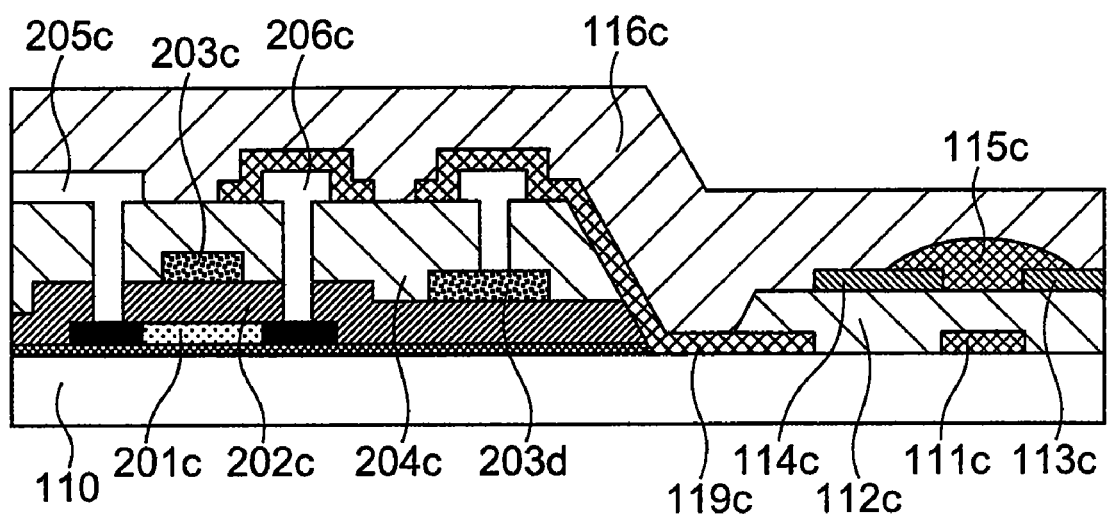
FIG. 5 is a cross section structure diagram of the display device which is the first embodiment.

Here, in FIGS. 4A and 4B, a connection example of the drain electrode of the low-temperature poly Si-TFT and each electrode of the organic semiconductor TFT is shown, but it is possible to connect the gate electrode of the low-temperature poly Si-TFT and each electrode of the organic semiconductor TFT depending on the circuit configuration as the need arises. For example, an example in which a gate electrode 203c of the low-temperature poly Si-TFT and a gate electrode 111c of the organic semiconductor TFT are connected is shown in FIG. 5. A cross section structure in which the gate electrode 203c is pulled out by the same wire layer 203d and is connected to a wire layer 119c in which the gate electrode 111c is pulled out of the organic semiconductor via an Al electrode is shown.

The effects obtained by this embodiment are as the followings. In the conventional manufacturing method, the pixel array circuit and the peripheral integrated circuit are connected by providing the Si integrated circuit chip on the periphery of the pixel array by the mounting technique. Because of this, when manufacturing a thin type and light weight image display device on the plastic substrate which has the flexibility and can be used with the radius of curvature of about 5 cm or below as in this embodiment, there are the problems such as that at the impact or when the device is bended the connection part is broken or that the peripheral Si integrated circuit chip is broken. The structure of the TFT substrate of this embodiment has the structural features such as that the low-temperature poly Si-TFT integrated circuit and the single crystal Si thin film integrated circuit are provided on the plastic substrate after removing the glass support substrate or the Si support substrate of when it was manufactured and making the integrated circuit a thin film with its total film thickness no more than 5 μm, and that after this the organic TFT and the wire are formed by the solution process and/or printable process and this solution processed and/or printed wire is extended up to the upper part of the electrode of the low-temperature poly Si-TFT and the single crystal Si thin film integrated circuit and connected. For this reason, it is possible to avoid the problems of the conventional technique and to realize an active-matrix reflective image display device which has high durability for the impact and the bending and can be used being bended and can be mounted on a curved surface. By applying this, a display device such as a so-called electronic book becomes possible which can be used for reading and seeing color photographs being bended like paper.

As an electrode wire material used in this embodiment, the metal ink such as Ag ink, Au ink, etc. and a conductive organic material, a transparent electrode material, etc. can be used. As its solution process printable process, for example, a common printable process such as an ink jet method, an offset printing method, an electrophotographic printing method, a dispenser method, etc. and an electro plating/electroless plating can be used. As a gate insulation film, an organic polymer insulation film, a solution-processed SiO$_2$ film, a solution-processed high permittivity insulator, etc. can be used. As an organic semiconductor, a small molecular organic material such as pentacene and its derivative, porphyrin, etc. and a polymer organic material such as P3HT (poly(3-hexyl thiophene)), F8T2 (fluorene-thiophene copolymer), etc. can be used.

In this embodiment which has been described above, various changes such as the material, the display device, and the manufacturing method, etc. are possible without departing from the intension of the present invention. Also, the size of the device to be manufactured is not limited to this embodiment, and taking advantage of the feature of the solution process and/or printable process, for example, the manufacture of the device which has an area of no less than 1 m square is possible. Also, the poly Si-TFT and the organic TFT configurations are not limited to this embodiment. For example, in FIG. 4A, it is also possible to have a bottom-gate structure in which the gate electrode 203a of the poly Si-TFT is positioned in a part lower than a poly Si channel layer 201a or a top-gate structure in which the gate electrode 111a of the organic TFT is positioned in a part upper than the organic semiconductor layer 115a. The display device is not limited to this embodiment either and, for example, it is also possible to apply the TFT substrate of this embodiment to the transparent type liquid crystal device and provide a transparent type liquid crystal display device of thin type and light weight. Further, the solution process and/or printable process is taken as an example as a manufacturing method of the organic TFT in this embodiment, but it is not limited to this and it is needless to say that the effect of the present invention can be obtained by forming the organic TFT and the wire, for example, by the combination with the vacuum film forming such as evaporation, sputtering, etc. or a patterning method such as photolithograph/etching, etc.

Second Embodiment

The second embodiment of the present invention will be explained using FIG. 4 and FIG. 6 below. This embodiment is an embodiment in which the TFT substrate is manufactured by a self-alignment manufacturing method which can improve the alignment precision in an active-matrix reflective image display device of thin type and light weight as same as the one in the first embodiment.

Figure 6:
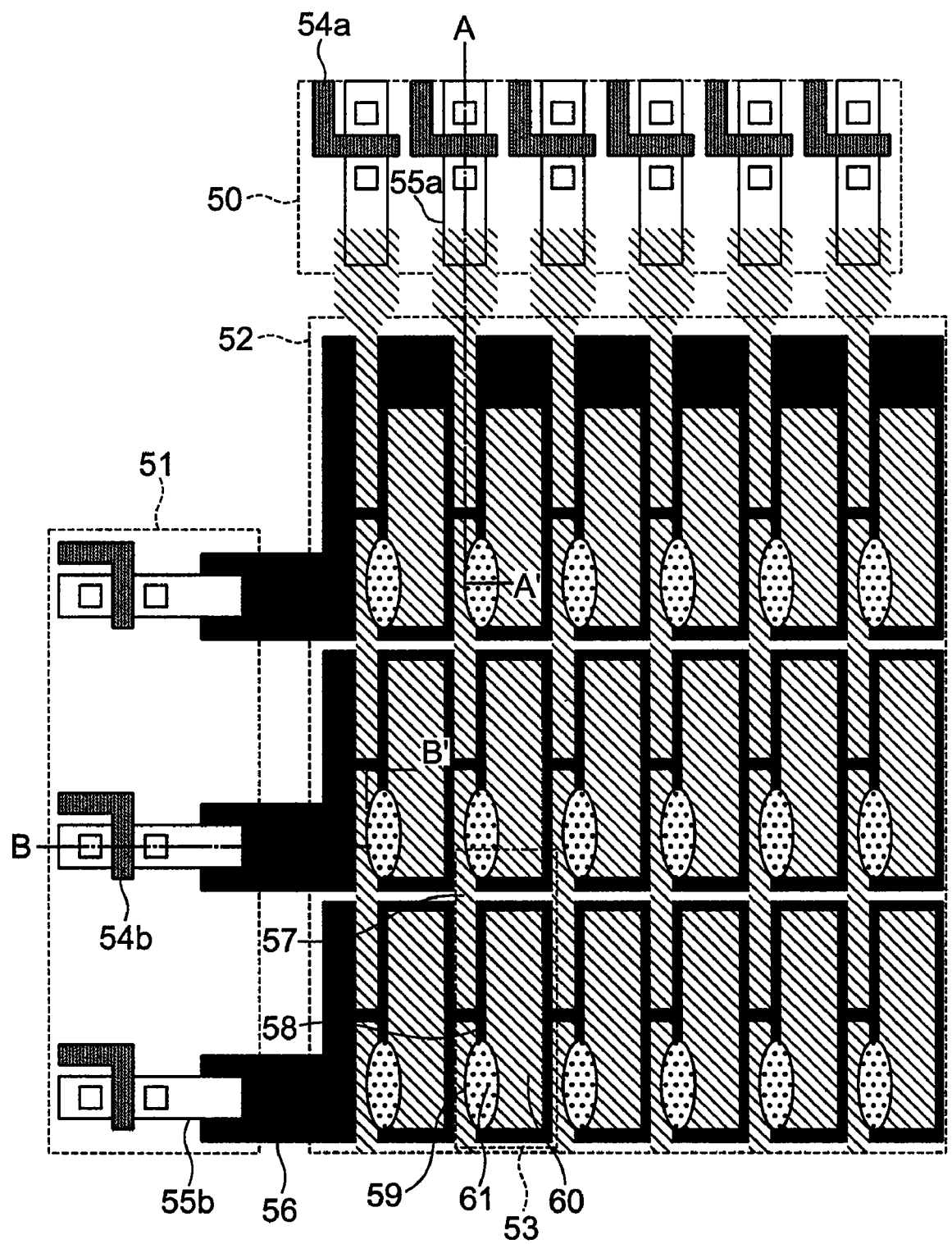
FIG. 6 is a schematic plan view of a display device which is a second embodiment.

FIG. 6 shows a part of a plan view embodying a part of the pixel array and the buffer TFT in the peripheral buffer circuit shown in FIG. 2. The cross section structures of between AA' and between BB' shown by the one dotted chain line in FIG. 6 are as shown in FIGS. 4A and 4B and are the same as the first embodiment. Also, the manufacturing method until affixing the peripheral integrated circuit configured with the low-temperature poly Si-TFT on the support substrate is the same as the first embodiment.

The manufacturing method and the material used for the organic TFT are the same as the first embodiment except for the self-alignment process which will be explained below. It will be explained the outline of the self-alignment process below. Namely, the process until the process to partially coat the gate insulation film 112a and 112b by the printable patterning process is the same as the first embodiment. Thereafter, after performing the surface process such as that the material is coated only in the area which is to be exposed, the exposure is performed from the reverse side of the substrate 110. On this occasion, a gate electrode 58 and a gate line 56 of FIG. 6 become the mask of the exposure. Thereafter, the electrode wire material of a drain line 57, a drain electrode 59, and a source electrode 60 is coated. On this occasion, the source electrode 60, the drain electrode 59, and the drain line 57 are coated with high precision and self-alignment to the gate electrode 58 only in the area where there is no pattern of the gate electrode 58 and the gate line 56. After being subject to the above-mentioned manufacturing processes, the gate electrode 58 of the organic TFT and a drain electrode 55b of the low-temperature poly Si-TFT are connected via the gate line 56, and also the drain electrode 59 of the organic TFT and a drain electrode 55a of the low-temperature poly Si-TFT are connected via the drain line 57.

In this second embodiment, as the self-alignment solution process and/or printable process is used, the material to form the source electrode 60 and the drain electrode 59 can be coated with high precision without alignment gap for the gate electrode 58. For this reason, it is possible to realize a high performance organic TFT and a high precision image display device reducing the parasitic capacity between the gate electrode of the organic TFT and the source and drain electrodes. Other than this, it is needless to say that the same effect of the present invention as the first embodiment can be obtained.

Third Embodiment

The third embodiment of the present invention will be explained using FIG. 1, FIG. 4, FIG. 7, and FIG. 8 below. This embodiment is an embodiment of a full color active-matrix organic electroluminescent display of thin type and light weight of which display device is the organic light emitting diode, its resolution is about 50~300 pixel/inch, its area is about from a few cm square to a few tens cm square, its thickness is no more than 1 mm and its weight is no more than 100 g.

The overall configuration of this embodiment is the same as the first embodiment and it is configured with the TFT substrate to drive pixel of the lower part and the display device of the upper part as shown in the schematic sketch diagram of FIG. 1, but it is different from the first embodiment in that the display device of the upper part is the organic light emitting diode.

Figure 7:
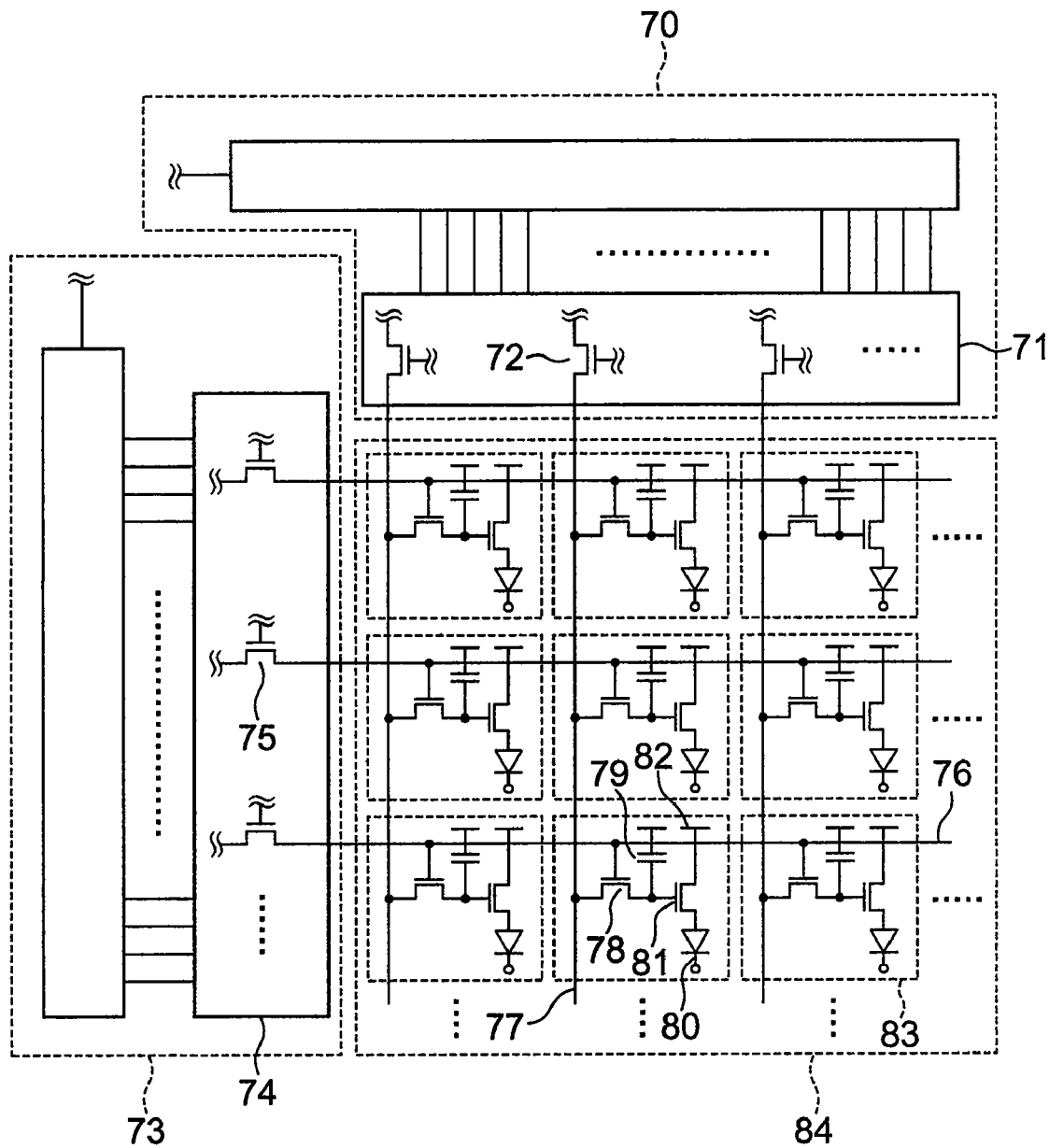
FIG. 7 is a schematic configuration diagram of a display device which is a third embodiment.

FIG. 7 is a panel configuration schematic diagram. In a pixel 83 an equivalent circuit is shown and each pixel is configured with a light emitting diode for display 80, a switching TFT 78, a TFT to drive light emitting diode 81, and a hold capacity 79, and the display part is configured with an array 84 in which these pixels are arranged in a matrix, and a part of that pixel array is shown in FIG. 7. These switching TFT and TFT to drive light emitting diode are configured with the organic TFT, and the light emitting diode for display is an organic light emitting diode which consists of a polymer organic material, an organic light emitting diode which consists of a low molecule organic material, etc. The hold capacity is the parasitic capacity of the switching TFT, the TFT to drive light emitting diode, and the wire, but it is possible to form it as a capacity device as the need arises. Also, the pixel circuit shown in FIG. 7 has the most basic configuration as the organic light emitting diode driving circuit, but it is also possible, for example, to configure various pixel circuits which improve the display characteristics such as a circuit which compensates the threshold voltage scattering and the shift of the TFT to drive light emitting diode 81, a voltage programming circuit, a current programming circuit, a digital signal driving circuit, etc. with the organic TFT and built them in the pixel.

The peripheral integrated circuit to drive pixel includes a scanning system (vertical system) circuit 73 and a signal system (horizontal system) circuit 70 and is configured with the low-temperature poly Si-TFT. The scanning system circuit includes an address decoder, a shift register, a level shifter, and a buffer circuit 74, etc. and the signal system circuit includes an address decoder, a shift register, a level shifter, a DA converter circuit, a pixel driving signal generating circuit, and a buffer circuit 71, etc. In each of the buffer circuits, a part of buffer TFTs 72 and 75 are shown. The switching TFT 78 of each pixel is driven by the buffer TFT via a drain line 77 and a gate line 76.

Figure 8:
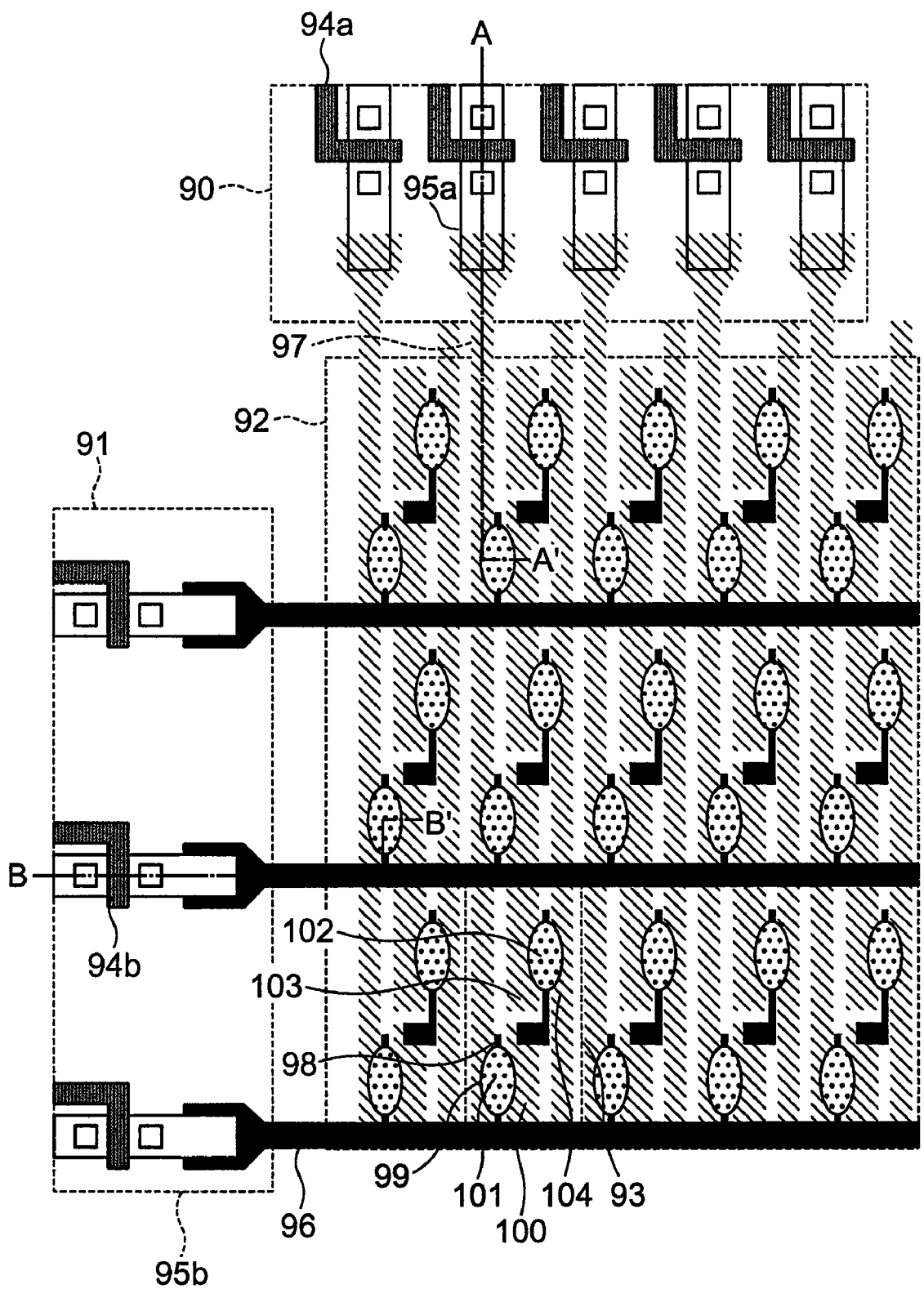
FIG. 8 is a schematic plan view of the display device which is the third embodiment.

Next, a part of a plan view embodying the pixel array and the buffer TFT in the peripheral buffer circuit shown in FIG. 7 is shown in FIG. 8. As the TFT substrate manufacturing method of this embodiment is the same as the first embodiment, the cross section structures between AA' and between BB' shown by the one dotted chain line in FIG. 8 are the same as the first embodiment and each of them is shown in FIGS. 4A and 4B respectively. In FIG. 8, a part of the array of pixel 93 is shown in 5×3. In this pixel area, a plane structure of the switching TFT 78 of the pixel equivalent circuit and the TFT to drive light emitting diode 81 of FIG. 7 is shown. The gate line 76 and the drain line 77 of FIG. 7 correspond to a gate line 96 and a drain line 97 of FIG. 8 respectively. Also, the channel, the source electrode, and the drain electrode of the switching TFT 78 correspond to an organic semiconductor 101, a source electrode 100, and a drain electrode 99 of FIG. 8 respectively. Also, the channel, the source electrode, and the drain electrode of the TFT to drive light emitting diode 81 correspond to an organic semiconductor 102, a source electrode 104, and a drain electrode 103 connected to the power supply line of FIG. 8 respectively, and this drain electrode is connected to an anode of the light emitting diode.

A part of a plane structure of the buffer TFTs 72 and 75 configuring the buffer circuits 71 and 74 of FIG. 7 are shown in 90 and 91 of FIG. 8 respectively. In FIG. 8, the drain electrode 99 of the switching TFT is connected to a drain electrode 95a of the buffer TFT in the signal system buffer circuit via the drain line 97 formed with the same wire layer. Also, a gate electrode 98 of the switching TFT is connected to a drain electrode 95b of the buffer TFT in the scanning system buffer circuit via the gate line 96 formed with the same wire layer.

In this embodiment, the manufacturing process to provide the low-temperature poly Si-TFT substrate which is the peripheral integrated circuit on the support substrate 110 of FIG. 4, the manufacturing process to provide the single crystal Si thin film integrated circuit as occasion arises, and the manufacturing process to manufacture the organic TFT configuring the pixel circuit are the same as the first embodiment, and its cross section structure diagram is the same as FIG. 4. Therefore, the cross section structure between AA' and between BB' shown by the one dotted chain line in FIG. 8 correspond to FIGS. 4A and 4B respectively. In particular in this embodiment, in order to improve the performance of the pixel circuit, for the film forming of the organic semiconductors 101 and 102 of FIG. 8, solution-processed pentacene is used, the solvent drying process after the printing is controlled, and the crystal growth is expedited so that its direction is unified in the current direction between the source and drain electrodes. As a result, the field effect mobility of the organic TFT is improved to be no less than 1 $cm^2/Vs$.

The structure of the TFT substrate of this embodiment also has the structural features in the same way as the first embodiment such as that the low-temperature poly Si-TFT integrated circuit and the single crystal Si thin film integrated circuit are provided on the plastic substrate after removing or making them thin films the glass support substrate and the Si support substrate of when the circuits were manufactured and that after this the organic TFT and the wire are formed by the solution process and/or printable process and this solution-processed and/or printable wire is connected to the low-temperature poly Si-TFT by being extended to the upper part of the electrode of the single crystal Si thin film integrated circuit, etc. For this reason, it is possible to avoid the problems in the conventional technique and to realize a full color active-matrix organic electro-luminescence display which has high durability for the impact and the bending and which can be used being bended and can be mounted on a curved surface. By applying this, a display device which is of thin type and light weight and is superior in portability and with which the high quality moving image, television broadcasting, and movies can be seen becomes possible.

Fourth Embodiment

The fourth embodiment of the present invention will be explained using FIGS. 9, 10 below. This embodiment is an embodiment in which the manufacturing method of the TFT substrate in an active-matrix display of thin type and light weight shown in the first to third embodiments is partially changed. The cross section structure between AA' of FIG. 3 is shown in FIG. 9 and the cross section structure between BB' of FIG. 3 is shown in FIG. 10 when the TFT substrate is manufactured by the manufacturing method of this embodiment.

It will be explained the outline of the changed manufacturing method below. Namely, in the manufacturing method of the low-temperature poly Si-TFT of the first embodiment explained in FIG. 15A, after selectively opening the connection areas for the source electrode and the drain electrode, without forming the source electrode 205 and the drain electrode 206 consisting of a metal film of Al, etc., the low-temperature poly Si-TFT integrated circuit is provided on the support substrate 110 shown in FIG. 15E after being processed to the desired area. Thereafter, when the electrode and the wire of the organic semiconductor TFT are formed, the electrodes of the low-temperature poly Si-TFT are formed with the same layer.

Figure 9:
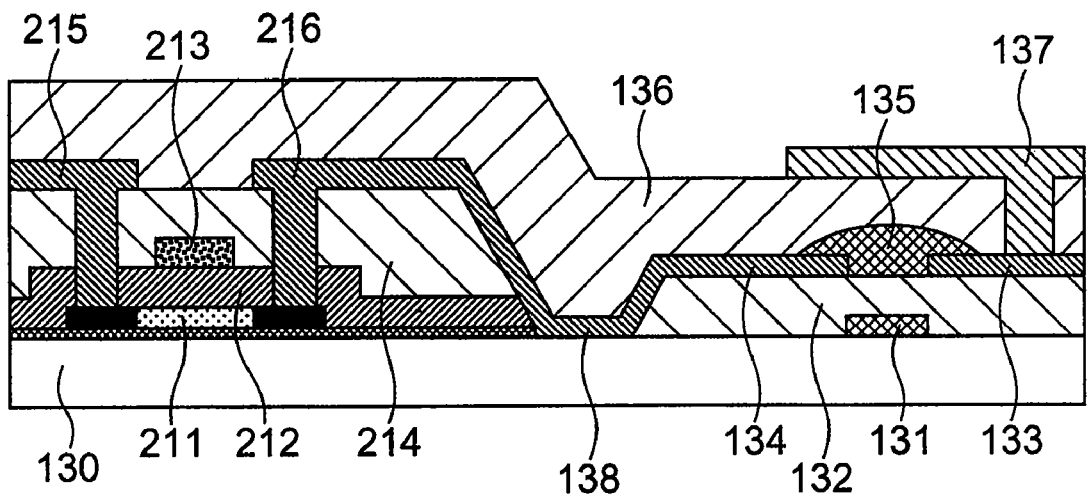
FIG. 9 is a cross section structure diagram of a display device which is a fourth embodiment.
Figure 10:
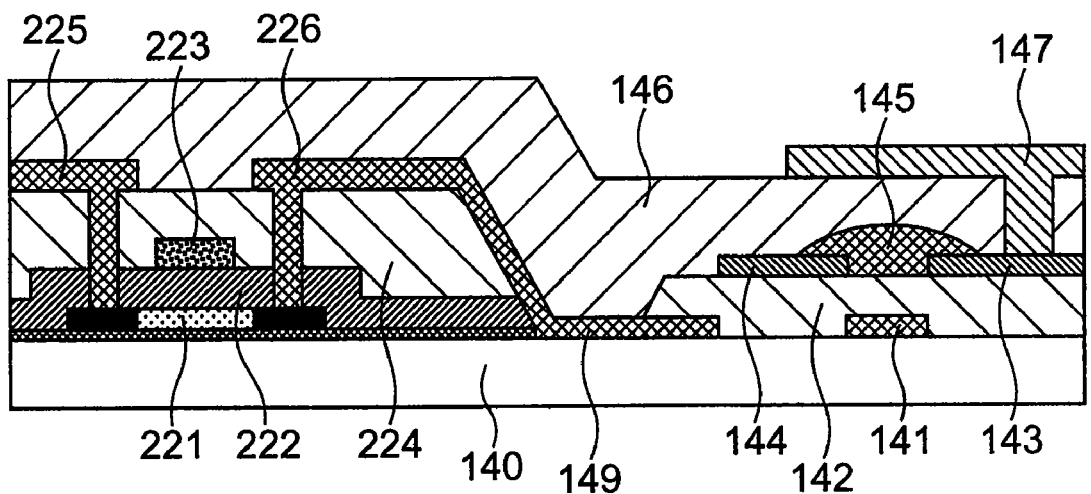
FIG. 10 is a cross section structure diagram of the display device which is the fourth embodiment.

In the embodiment shown in FIG. 9, in the manufacturing method of the organic semiconductor TFT, a drain line 138 formed by the solution process and/or printable process is extended and at the same time a source electrode 215 and a drain electrode 216 of the low-temperature poly Si-TFT are formed. Also in the embodiment shown in FIG. 10, a gate line 149 formed by the solution process and/or printable process is extended and at the same time a source electrode 225 and a drain electrode 226 of the low-temperature poly Si-TFT are formed. Here, instead of the solution process and/or printable process, for example, it is also possible to form a gate electrode 141 of the organic semiconductor TFT and the gate line 149 and the source electrode 225 of the low-temperature poly Si-TFT and the drain electrode 226 at the same time by accumulating a metal film of Al, etc. by the conventional sputtering, etc. and performing the patterning by the lithography process.

Also in this embodiment, the effect which can be obtained in the first to third embodiments can be obtained in the same way. Further in this embodiment, as the electrode of the poly Si-TFT and the electrode of the organic semiconductor TFT are connected by the same wire layer, both electrodes can be connected more securely.

Fifth Embodiment

The fifth embodiment of the present invention will be explained using FIGS. 16A~16D which are manufacturing process cross section diagrams and FIG. 11 below. This embodiment is an embodiment in which in the active-matrix display of thin type and light weight shown in the first to third embodiments, the manufacturing method of the low-temperature poly Si-TFT substrate and the installing method of the peripheral integrated circuit substrate of the same on the support substrate are changed. The cross section structure between AA' of FIG. 3, FIG. 6, or FIG. 8 when it is manufactured by the manufacturing method of this embodiment is shown in FIG. 11.

It will be explained the outline of the manufacturing process to provide the low-temperature poly Si-TFT integrated circuit on the plastic support substrate by FIGS. 16A~16D below. Namely, first in FIG. 16A, for example, the manufacturing method to form the low-temperature poly Si-TFT on a glass support substrate 230 is the same as the first to third embodiments, but after accumulating a protection film 234, when selectively opening connection areas for a source electrode 235 and a drain electrode 236, in an area 238 where the wire 158 of FIG. 11 and the electrode 236 are connected at the same time, the aperture part is made to penetrate until it reaches to the glass support substrate 230. Thereafter, with the same method as the first to third embodiments, for example, by sputtering, etc. the source electrode 235 and the drain electrode 236 consisting of a metal film of Al, etc. are provided and the low-temperature poly Si-TFT is formed. Next, a second protection film 237 is accumulated and gets planarization in this embodiment.

Figure 16A:
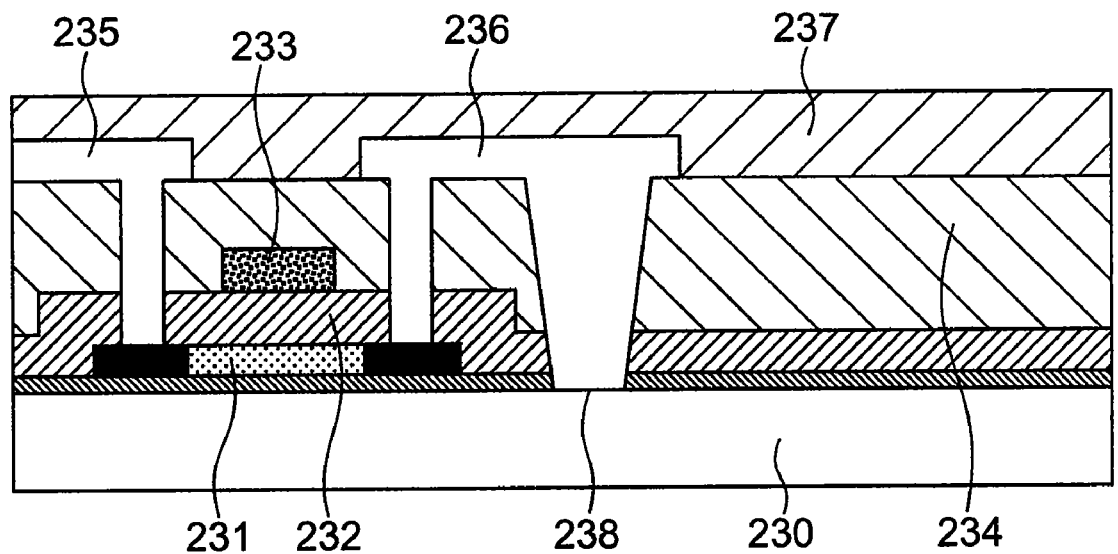
FIG. 16A is a TFT substrate manufacturing process cross section structure diagram of the display device which is the fifth embodiment.
Figure 16B:
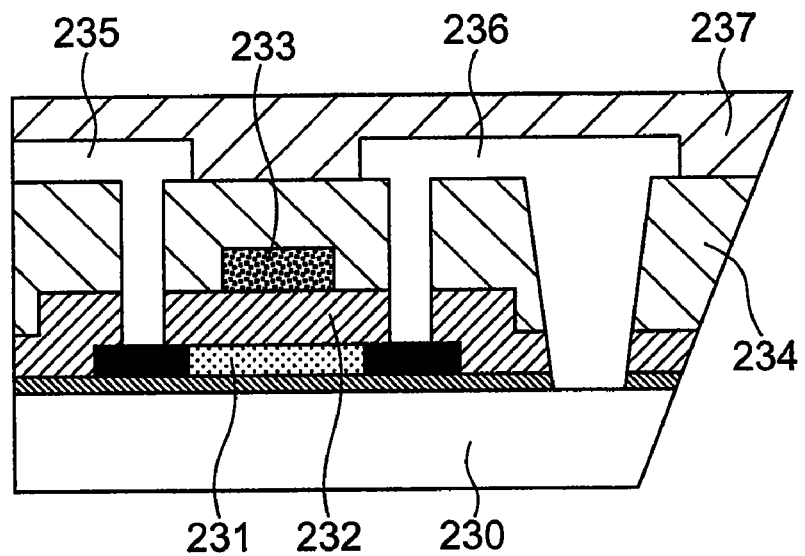
FIG. 16B is a TFT substrate manufacturing process cross section structure diagram of the display device which is the fifth embodiment.
Figure 16C:
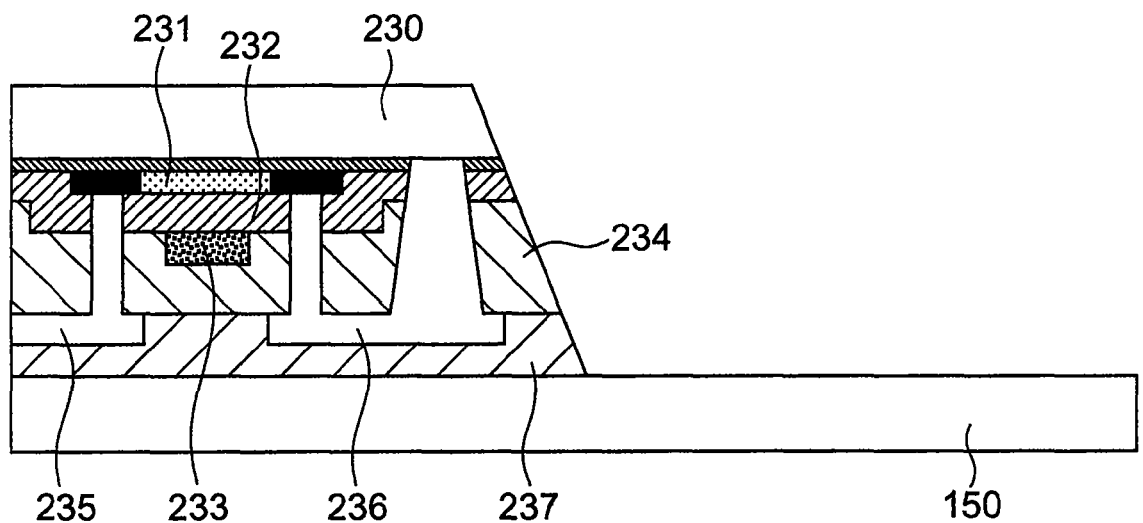
FIG. 16C is a TFT substrate manufacturing process cross section structure diagram of the display device which is the fifth embodiment.
Figure 16D:
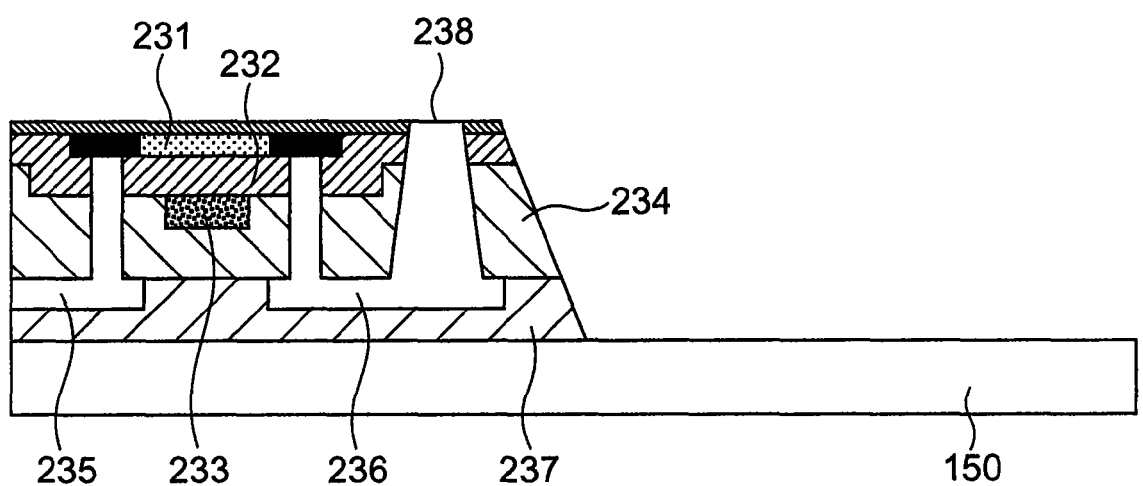
FIG. 16D is a TFT substrate manufacturing process cross section structure diagram of the display device which is the fifth embodiment.

Next, as shown in FIG. 16B, the low-temperature poly Si-TFT integrated circuit substrate is cut out to the desired area tapering the cross section form. Thereafter as shown in FIG. 16C, after laminating a gas barrier layer of water, oxygen, etc. on a plastic support substrate 150 with the thickness of about 200 μm or below, the cut out low-temperature poly Si-TFT integrated circuit substrate is inverted up and down and provided on the plastic support substrate 150 by the method of affixing, etc. Further as shown in FIG. 16D, the glass support substrate 230 of the low-temperature poly Si-TFT integrated circuit is removed by the method of polishing, etching, etc. On this occasion, as the metal material of the electrode 236 is filled until it penetrates to the glass support substrate in the connection area 238, it is exposed. In this way, it is possible to provide a very thin low-temperature poly Si-TFT integrated circuit substrate with the total film thickness of no more than 5 μm on the plastic substrate 150. Also, as the side form of a gate insulation film 232 and the protection films 234, 237 is a tapered shape, when providing the wire which will be formed in the printing process after this extending it on the low-temperature poly Si-TFT integrated circuit substrate, it is possible to improve the coverage of the wire in the step part and make the faulty such as a snapping of a wire, etc. hardly occur.

Figure 11:
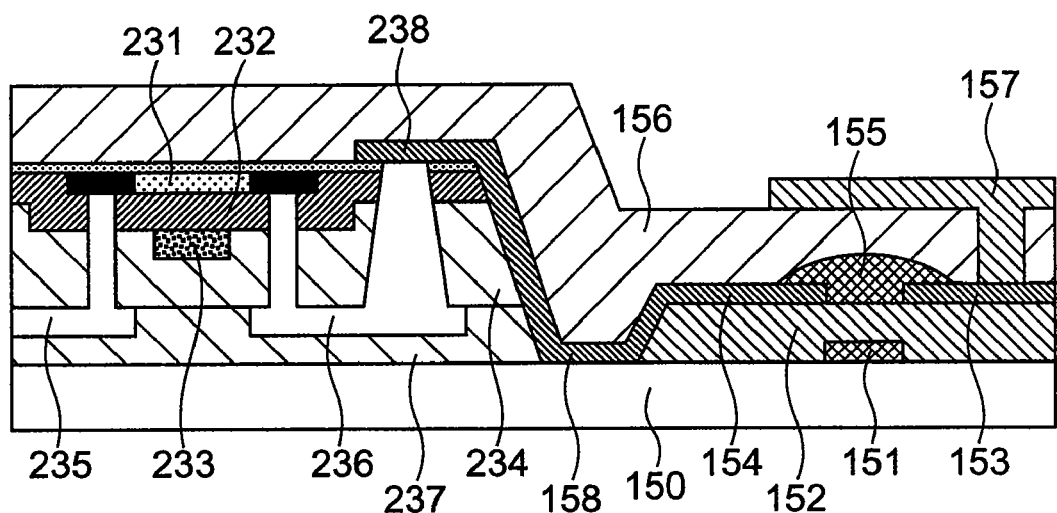
FIG. 11 is a cross section structure diagram of a display device which is a fifth embodiment.

Next, as shown in FIG. 11, the organic TFT and the wire are formed by the solution process and/or printable process and the low-temperature poly Si-TFT integrated circuit and the organic TFT pixel circuit array are connected in the same way as the first embodiment. In FIG. 11, a cross section structure in which the drain electrode 236 of the low-temperature poly Si-TFT and a drain electrode 154 of the organic semiconductor TFT are connected via the drain line 158 is shown. In the connection area 238, as the metal material of the drain electrode 236 of the low-temperature poly Si-TFT is exposed, it can be well connected to the drain electrode 154 of the organic semiconductor TFT.

Also in this embodiment, the effect which can be obtained in the first to third embodiments can be obtained in the same way. Further in this embodiment, as the glass support substrate of the integrated circuit is removed after affixing the low-temperature poly Si-TFT integrated circuit on the plastic substrate 150, it has an effect to make the removing process of the support substrate more simplified than the first to third embodiments.

Sixth Embodiment

Figure 12:
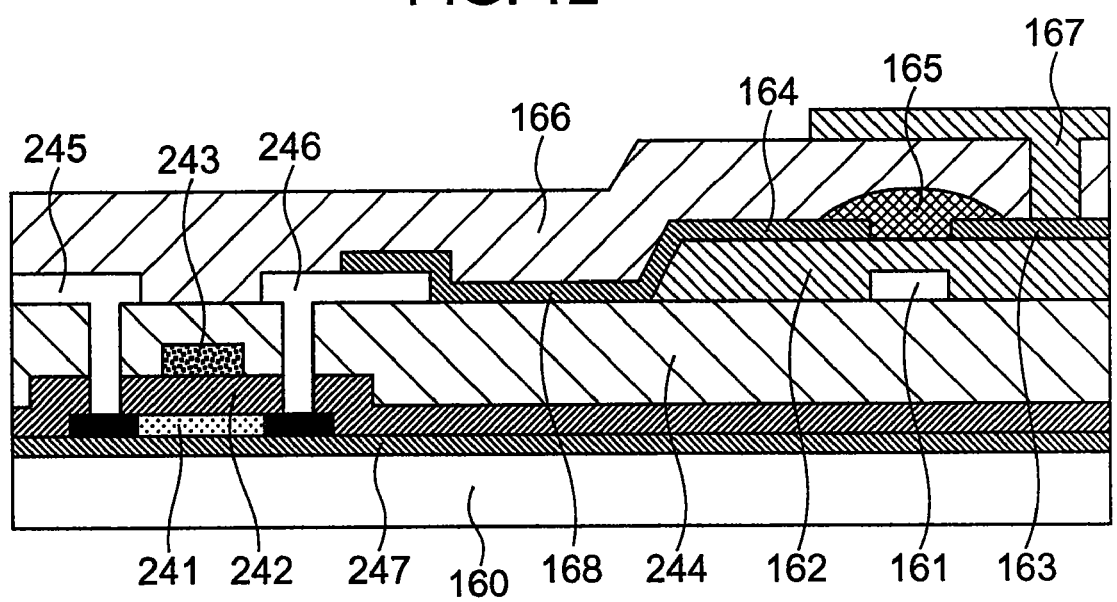
FIG. 12 is a cross section structure diagram of a display device which is a sixth embodiment.

The sixth embodiment of the present invention will be explained using FIG. 12 below. This embodiment is an embodiment in which in the active-matrix display of thin type and light weight shown in the first to third embodiments, the low-temperature poly Si-TFT substrate is directly formed on a substrate 160 by making its manufacturing temperature to be the low temperature of no more than 400° C. and the affixing process of the peripheral integrated circuit is omitted. The cross section structure between AA' of FIG. 3, FIG. 6, or FIG. 8 when it is manufactured by the manufacturing method of this embodiment is shown in FIG. 12.

It will be explained the outline of the manufacturing method of the low-temperature poly Si-TFT below. Namely, for example in this embodiment, a channel layer 241 consisting of the poly Si film is formed by directly accumulating a poly Si film by CVD method and the like and performing the patterning after laminating a protection film 247 which has both of the protection function of the support substrate and the gas barrier function such as water, oxygen, and the like on the support substrate 160 which has the flexibility to be usable with the radius of curvature of about 5 cm or below and has the heat resistance of no less than 300° C. As another method to form the poly Si film, the crystallization of the amorphous Si film by laser annealing is also possible. Next, a gate insulation film 242 consisting of a Si oxide film is accumulated, for example, by sputtering, CVD method, etc. Next, a gate electrode 243 consisting of a metal film of Mo, W, etc. is accumulated, for example, by sputtering, etc. and gets patterning. Next, the install of the impurity necessary to form the TFT is performed and after accumulating a protection film 244, the connection areas for a source electrode 245 and a drain electrode 246 are selectively opened. Next, the source electrode 245 and the drain electrode 246 are formed by accumulating a metal film of Al, etc. for example by sputtering, etc. and performing the patterning. On this occasion in this embodiment, a gate electrode 161 of the organic semiconductor TFT is formed at the same time. Here, as though not shown in FIG. 12, in the cross section structure between BB' of FIG. 3, FIG. 6, or FIG. 8, the drain electrode 246 of the poly Si-TFT and the gate electrode 161 of the organic semiconductor TFT are connected by the same Al metal layer. In this way, the peripheral integrated circuit consisting of the low-temperature poly Si-TFT is formed.

Next, the organic semiconductor TFT circuit of the pixel array area is formed by the same manufacturing method as the first to third embodiments using the solution process and/or printable process. However in this embodiment, as the gate electrode 161 of the organic semiconductor TFT is formed at the same time in the above-mentioned manufacturing process of the source electrode 245 and the drain electrode 246 of the low-temperature poly Si-TFT, the manufacturing process of the gate electrode of the organic semiconductor TFT which is necessary in the first to third embodiments can be omitted. It will be explained the outline of the manufacturing method of the organic semiconductor TFT below. First, a gate insulation film 162 consisting of, for example, a polymer organic material is partially coated by the printing process. Next, a source electrode 163, a drain electrode 164, and a drain line 168 are formed by the printable patterning process of metal ink. On this occasion, the drain electrode 164 of the organic TFT and the drain electrode 246 of the low-temperature poly Si-TFT are connected by extending and providing the drain line 168 formed by the printed wiring up to the upper part of the drain electrode 246 of the low-temperature poly Si-TFT. Next, an organic semiconductor film 165 is selectively coated only in the area which is to be the channel of the organic TFT by the printable patterning process. Next, a protection film 166 consisting of, for example, a polymer organic material is selectively coated by the printable patterning process in both TFT areas of the organic TFT and the low-temperature poly Si-TFT. Finally, a pixel electrode 167 is formed by the printable patterning process and the TFT substrate is completed.

Also in this embodiment, the effect which can be obtained in the first to third embodiments can be obtained in the same way. Further in this embodiment, as the gate insulation film 242 of the low-temperature poly Si-TFT and the protection film 244 function also as protection film of the organic semiconductor TFT in addition to the protection film 247, a higher gas barrier effect for water, oxygen, etc. can be obtained compared with the first to third embodiments.

Seventh Embodiment

The seventh embodiment of the present invention will be explained using FIG. 13 below. This embodiment is an embodiment which configures a complementary-TFT circuit by manufacturing the low-temperature poly Si-TFT which has an n-channel and the organic semiconductor TFT which has a p-channel and combining them applying the present invention to the peripheral integrated circuit of the first to sixth embodiments. As a manufacturing method, the manufacturing process of the sixth embodiment is taken as an example.

Figure 13A:
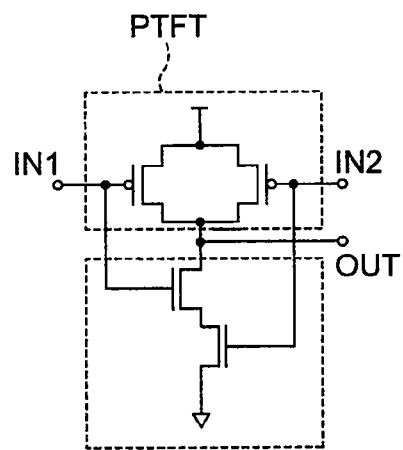
FIGS. 13A, 13B and 13C are a peripheral integrated circuit diagram, a schematic plan view, and a cross section structure diagram of a display device which is a seventh embodiment.

As an example of the complementary-TFT circuit, a circuit diagram of a two-input NAND gate is shown in FIG. 13A. A p-channel TFT area and an n-channel TFT area which configure the circuit are denoted by PTFT and NTFT respectively. A two-input complementary-TFT-NAND gate is configured with two p-channel TFTs formed with the organic semiconductor TFT and two n-channel TFTs formed with the low-temperature poly Si-TFT. Input terminals are denoted by IN1, IN2, and output terminals are denoted by OUT.

Figure 13B:
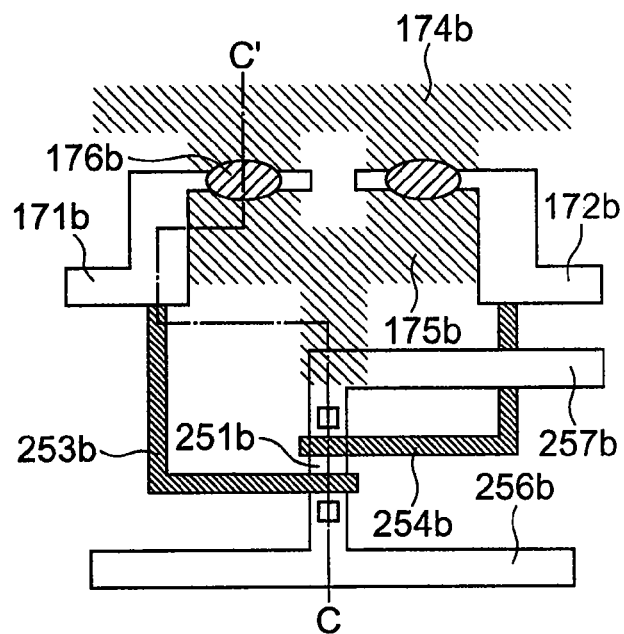
Figure 13C:
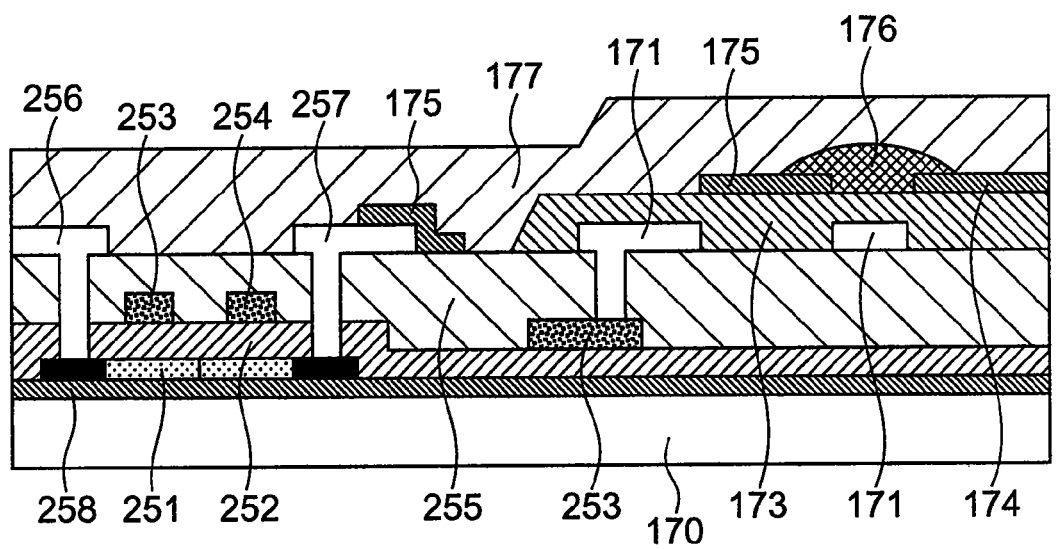

A plan view of a part corresponding to one gate of the plane structure embodying this circuit is shown in FIG. 13B and a cross section structure between CC' of this plan view is shown in FIG. 13C. The manufacturing processes of each of the TFTs are as being explained in the sixth embodiment. Gate electrodes of the organic semiconductor TFT are denoted by 171$b$, 172$b$ of FIGS. 13B and 171 of FIG. 13C. Gate electrodes of the low-temperature poly Si-TFT are denoted by 253$b$, 254$b$ of FIGS. 13B and 253, 254 of FIG. 13C. These gate electrodes 171$b$ and 172$b$ are connected to 253$b$ and 254$b$ and configure the input terminals IN1 and IN2 respectively. Also, a drain electrode 175$b$ of the organic semiconductor TFT is connected to a drain electrode 257$b$ of the low-temperature poly Si-TFT and configures the output terminal OUT. Also, a source electrode 174$b$ of the organic semiconductor TFT and a source electrode 256$b$ of the low-temperature poly Si-TFT are connected to the power supply lines respectively and configure the two-input complementary-TFT-NAND gate.

In this embodiment, it is possible to reduce the power consumption of the peripheral integrated circuit and to make the peripheral integrated circuit have a variety of functions by forming the organic semiconductor TFT not only in the pixel array circuit but also within the peripheral integrated circuit, combining it with the low-temperature poly Si-TFT, and configuring a part of the peripheral integrated circuit by a complementary-TFT circuit. Now, in this embodiment the manufacturing method of the sixth embodiment is taken as an example, but the manufacturing method of the first to fifth embodiments other than this are possible. For example, it is possible to configure the complementary-TFT circuit by manufacturing the p-channel organic semiconductor TFT after installing the n-channel low-temperature poly Si-TFT substrate on the periphery and connect it by the wire. In this way also, the same effect as this embodiment can be obtained.

Eighth Embodiment

Figure 14:
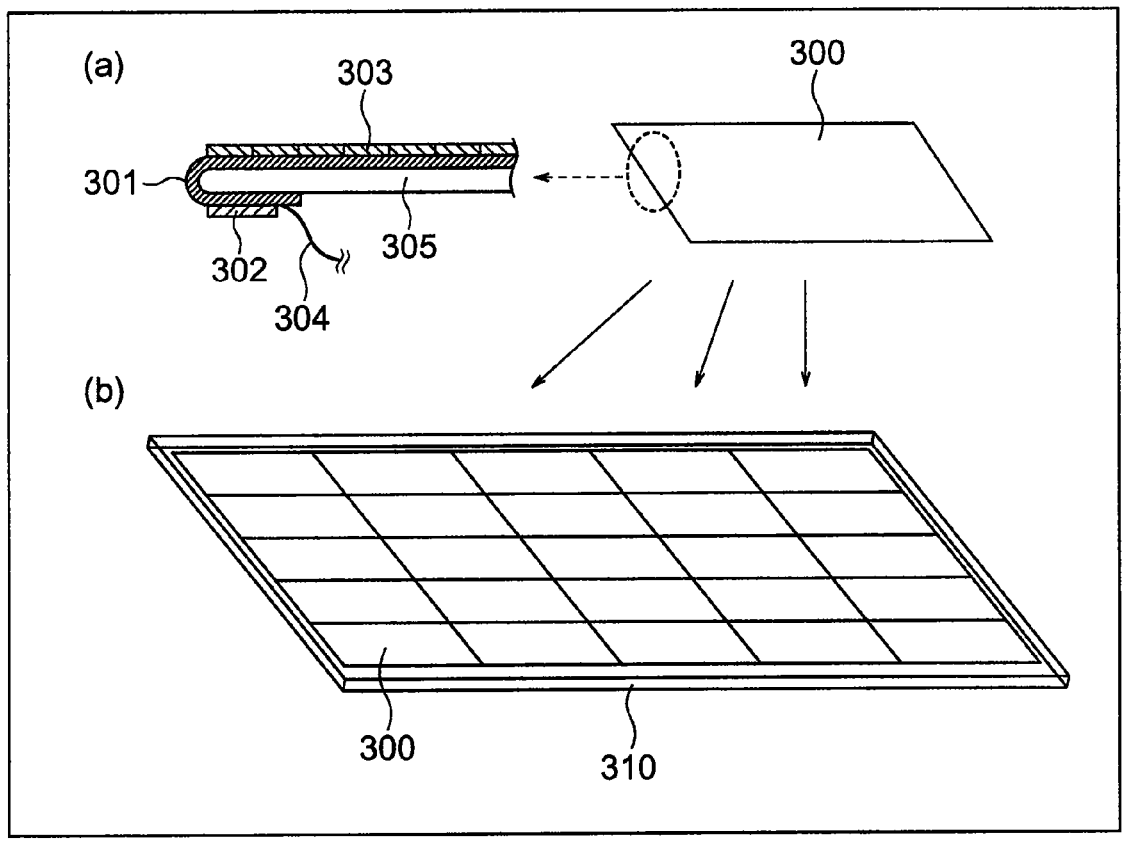
FIG. 14 is a cross section structure diagram and a schematic sketch diagram of a display device which is an eighth embodiment.

The eighth embodiment of the present invention will be explained using FIG. 14 below. This embodiment is an example in which a large image display device of, for example, about 1.5 m by 2 m by applying the thin type and light weight active-matrix display which is formed in the above-mentioned first to seventh embodiments and aligning a plurality of these devices. It will be explained the outline of the structure below.

A schematic cross section diagram of a part surrounded by the dotted line of one active-matrix display 300 is shown in FIG. 14A. In this embodiment, the image display device is formed on a support substrate 301 which has the flexibility to be usable with the radius of curvature of no more than 5 mm. A peripheral integrated circuit 302 and a cable 304 for the power supply and data transfer can be turned in the reverse side of another support substrate 305 by bending this flexible substrate 301. For this reason, it is possible to configure an image display device with the frame of no more than 2 mm making the peripheral area other than a pixel array 303 not being seen from the obverse side. A diagram in which the image display devices which have been processed in this way are aligned on the support substrate 310 without spaces and regularly is shown in FIG. 14B. The cables 304 of each of the image display devices 300 are on the reverse side of this image device and they are connected to the power supply and an image driving device which supplies the image data in the condition not being seen from the display area of the obverse side. The display data is sent in a time series from this image driving device and it is made to function as one large display device as a whole. In this way, it is possible to configure a large image display device easily.

In the above first to eighth embodiments, the image display device is taken as an example in all of them, but it is not limited to this. For example, other than the display device, it is possible to realize a system display device of thin type and light weight which has a built-in function other than the display such as a passive element for communication, a sensor, a battery, etc. and has high durability for the impact and the bending. Also, it is possible to realize an electronic device which has high durability for the impact and the bending and can be used being bended and can be mounted on a curved surface by applying the integrated circuit array substrate configured with the organic semiconductor TFT to a sensor array, an actuator array, a card with RF-ID function, an electronic label with RF-ID function, etc.

Here, the technical items regarding this embodiment are as the followings.

1. A manufacturing method of an image display device comprising an image display part configured with a plurality of pixels and a peripheral integrated circuit configured with a plurality of circuit blocks arranged on the periphery of the display part, wherein a pixel circuit of said display part has an organic semiconductor TFT device and said peripheral integrated circuit has a Si transistor device or a poly Si-TFT device, comprising the steps of:

(a) after forming said Si transistor device or said poly Si-TFT device on a first support substrate and after making the thickness of the surface of the side on which said device is not formed of said first support substrate thin, fixing the surface of the side on which said device is formed to a second support substrate, or after forming either said Si transistor device or said poly Si-TFT device on said first support substrate and after providing the second support substrate on the opposite side of said first support substrate side of either said Si transistor device or said poly Si-TFT device, making the thickness of the surface of the side on which said device is not formed of said first support substrate, or removing the first support substrate, (b) forming a matrix image display array part by forming an organic semiconductor TFT and a wire layer on said second support substrate by printing after said (a) step, (c) connecting between an electrode of said organic semiconductor TFT device and an electrode of either said Si transistor device or said poly Si-TFT device by the wire layer formed on said second support substrate.

2. A manufacturing method of an image display device of said 1 wherein said Si transistor is a single crystal Si thin film transistor from which the support Si substrate of thin film SOI substrate is removed.

1, 7: support substrate, 2: display pixel, 3: Si integrated circuit, 4a, 4b: poly Si-TFT integrated circuit, 5: wire, 6: pixel circuit array, 10, 70: signal system circuit, 11, 71: signal system buffer circuit, 12, 15, 72, 75: buffer TFT, 13, 73: scanning system circuit, 14, 74: scanning system buffer circuit, 30, 50, 90: signal system buffer circuit, 31, 51, 91: scanning system buffer circuit, 32, 52, 92: pixel circuit array, 33, 53, 93: pixel, 34a, 34b, 54a, 54b, 94a, 94b: gate electrode of poly Si-TFT, 35a, 35b, 55a, 55b, 95a, 95b: drain electrode of poly Si-TFT, 36, 56, 96: gate line, 37, 57, 97: drain line, 38, 58, 98: gate electrode of organic semiconductor TFT, 39, 59, 99, 103: drain electrode of organic semiconductor TFT, 40, 60, 100: source electrode of organic semiconductor TFT, 41, 61, 101, 102: organic semiconductor, 104: power supply line, 110, 130, 140, 150, 160, 170, 200, 208, 230: support substrate, 111a, 111b, 111c, 131, 141, 151, 161, 171, 171b, 172b: gate electrode of organic semiconductor TFT, 112a, 112b, 112c, 132, 142, 152, 162, 173: gate insulation film of organic semiconductor TFT, 113a, 113b, 113c, 133, 143, 153, 163, 174, 174b: source electrode of organic semiconductor TFT, 114a, 114b, 114c, 134, 144, 154, 164, 175, 175b: drain electrode of organic semiconductor TFT, 115a, 115b, 115c, 135, 145, 155, 165, 176, 176b: organic semiconductor, 116a, 116b, 116c, 136, 146, 156, 177: organic protective film, 117a, 117b, 137, 147, 157, 167: pixel electrode, 118, 138, 158, 168: drain line, 119b, 119c, 149: gate line, 201, 300: display device, 301, 305, 310: support substrate, 302: poly Si-TFT integrated circuit, 303: pixel, 304: cable line It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A thin film transistor (TFT) device comprising:
a matrix array part including a plurality of circuit blocks and a peripheral integrated circuit part, the peripheral integrated circuit part including a plurality of integrated circuit blocks arranged on a periphery of said matrix array part, wherein
said matrix array part includes an organic semiconductor TFT device, and said peripheral integrated circuit part includes at least one of a Si transistor device and a poly Si-TFT device;
said organic semiconductor TFT device and at least one of said Si transistor device and said poly Si-TFT device are provided on the same substrate; and
an electrode of said organic semiconductor TFT device and an electrode of at least one of said Si transistor device and said poly Si-TFT device are connected by a wire layer provided on the substrate.

2. A thin film transistor device of claim 1, wherein there is a step between said matrix array part and said peripheral integrated circuit part, and in order to reduce the effect at said step of said wire layer which is wired over this step, a tapered part to smooth the difference of the height at the step part is provided and a part of said wire layer is provided on said tapered part.

3. A thin film transistor device of claim 1, wherein said Si transistor is a single crystal Si thin film transistor from which a support Si substrate of a thin film SOI (Silicon on Insulator) substrate is removed.

4. An image display device comprising:
a display part including a plurality of pixels and a peripheral integrated circuit part, the peripheral integrated circuit part including a plurality of circuit blocks arranged on a periphery of the display part, wherein
pixel circuitry of said display part includes an organic semiconductor TFT device;
said peripheral integrated circuit part includes at least one of a Si transistor device and a poly Si-TFT device;
said pixel circuitry and at least one of said Si transistor device and said poly Si-TFT device are provided on the same substrate; and
an electrode of said organic semiconductor TFT device and an electrode of at least one of said Si transistor device and said poly Si-TFT device are connected by a wire layer provided on the substrate.

5. An image display device of claim 4, wherein said Si transistor is a single crystal Si thin film transistor from which a support Si substrate of a thin film SOI substrate is removed.

* * * * *